(12) United States Patent
Funk et al.

(10) Patent No.: US 9,793,095 B2
(45) Date of Patent: Oct. 17, 2017

(54) MICROWAVE SURFACE-WAVE PLASMA DEVICE

(71) Applicant: Tokyo Electron Limited, Tokyo (JP)

(72) Inventors: Merritt Funk, Austin, TX (US); Jianping Zhao, Austin, TX (US); Lee Chen, Cedar Creek, TX (US); Toshihiko Iwao, Sendai Miyagi (JP); Toshihisa Nozawa, Sendai Miyagi (JP); Zhiying Chen, Austin, TX (US); Peter Ventzek, Austin, TX (US)

(73) Assignee: TOKYO ELECTRON LIMITED, Tokyo (JP)

( * ) Notice: Subject to any disclaimer, the term of this patent is extended or adjusted under 35 U.S.C. 154(b) by 585 days.

(21) Appl. No.: 14/204,887

(22) Filed: Mar. 11, 2014

(65) Prior Publication Data

US 2014/0262042 A1    Sep. 18, 2014

Related U.S. Application Data

(60) Provisional application No. 61/785,448, filed on Mar. 14, 2013.

(51) Int. Cl.
    *C23C 16/00* (2006.01)
    *C23F 1/00* (2006.01)
    (Continued)

(52) U.S. Cl.
    CPC ... *H01J 37/32229* (2013.01); *H01J 37/32211* (2013.01); *H01J 37/32238* (2013.01); *H01L 21/67017* (2013.01); *H01L 21/67069* (2013.01)

(58) Field of Classification Search
    USPC ............. 118/715–733, 723 MW; 156/345.41
    See application file for complete search history.

(56) References Cited

U.S. PATENT DOCUMENTS

| 4,776,918 A | * | 10/1988 | Otsubo | ................. C23C 16/517 118/50.1 |
| 5,134,965 A | | 8/1992 | Tokuda et al. | |

(Continued)

OTHER PUBLICATIONS

International Patent Application Serial No. PCT/US2014/023724, "International Search Report," International Filing Date Mar. 11, 2014, Search Report mailed Jul. 25, 2014.

(Continued)

*Primary Examiner* — Rakesh Dhingra
(74) *Attorney, Agent, or Firm* — Rothwell, Figg, Ernst & Manbeck, P.C.

(57) ABSTRACT

A processing system is disclosed, having a power transmission element with an interior cavity that propagates electromagnetic energy proximate to a continuous slit in the interior cavity. The continuous slit forms an opening between the interior cavity and a substrate processing chamber. The electromagnetic energy may generate an alternating charge in the continuous slit that enables the generation of an electric field that may propagate into the processing chamber. The electric field may interact with process gas in the processing chamber to generate plasma for treating the substrate. The interior cavity may be isolated from the process chamber by a dielectric component that covers the continuous slit. The power transmission element may be used to control plasma density within the process chamber, either by itself or in combination with other plasma sources.

11 Claims, 20 Drawing Sheets

(51) Int. Cl.
*H01L 21/306* (2006.01)
*H01J 37/32* (2006.01)
*H01L 21/67* (2006.01)

(56) References Cited

U.S. PATENT DOCUMENTS

| | | | |
|---|---|---|---|
| 5,632,921 A | 5/1997 | Risman et al. | |
| 5,645,644 A * | 7/1997 | Mabuchi | H01J 37/32238 118/723 ME |
| 5,843,236 A * | 12/1998 | Yoshiki | H01J 37/32192 118/723 ME |
| 5,955,382 A * | 9/1999 | Yamauchi | H01J 37/32229 156/345.41 |
| 6,652,709 B1 * | 11/2003 | Suzuki | H01J 37/32192 118/723 MW |
| 7,348,732 B2 | 3/2008 | Espiau et al. | |
| 7,592,564 B2 | 9/2009 | Kumar et al. | |
| 8,136,479 B2 | 3/2012 | Sugai et al. | |
| 8,487,223 B2 | 7/2013 | Kimrey, Jr. | |
| 2006/0150914 A1 * | 7/2006 | Yamamoto | H01J 37/32192 118/723 MW |
| 2007/0054064 A1 * | 3/2007 | Ohmi | H01L 21/306 427/569 |
| 2007/0102403 A1 * | 5/2007 | Ohmi | H01J 37/32192 219/121.36 |
| 2009/0026963 A1 * | 1/2009 | Susuki | C23C 16/511 315/111.21 |
| 2009/0045749 A1 * | 2/2009 | Ganachev | H01J 37/32192 315/111.21 |
| 2011/0088848 A1 * | 4/2011 | Kim | C23C 16/511 156/345.41 |
| 2013/0192760 A1 | 8/2013 | Ikeda et al. | |

OTHER PUBLICATIONS

Written Opinion mailed Jul. 25, 2014 in PCT/US 14/23724 (11 pages).
International Search Report and Written Opinion mailed Jan. 29, 2015 in PCT/US14/64360 (11 pages).

* cited by examiner

MICROWAVE SURFACE-WAVE PLASMA DEVICE

CROSS REFERENCE TO RELATED APPLICATION

Pursuant to 37 C.F.R. §1.78(a)(4), this application claims the benefit of and priority to prior filed Provisional Application Ser. No. 61/785,448 filed Mar. 14, 2013, which is expressly incorporated herein by reference.

FIELD OF THE INVENTION

This invention relates to semiconductor processing technology, and more particularly, to apparatus and methods for controlling plasma properties of a processing system for treating a substrate.

BACKGROUND OF THE INVENTION

Typically, uniformly etching substrates using plasma (e.g., ionized gases) generated by microwave or radio frequency power can be difficult to accomplish. Conventional hardware and processing techniques may result in a non-uniform distribution of ions or plasma density across the substrate. The plasma density non-uniformity may result in non-uniform etching or removal of portions of the substrate. Traditional plasma sources may generate non-uniform plasma density across the substrate based on the location of the plasma source relative to the substrate. Generally, plasma sources are located opposite or parallel to the substrate. Unfortunately, plasma sources may not uniformly emit power across their surface to generate a uniform plasma density across the substrate. This may be due to the inability to emit power uniformly at the edge of the plasma source. Increasing the size of the plasma source to improve plasma density uniformity across the substrate may not be practical or possible. Thus, any means that can improve the plasma density near the edge of the substrate would be desirable.

SUMMARY OF THE INVENTION

This disclosure relates to a plasma processing system for controlling plasma density near the edge or perimeter of a substrate that is being processed. The plasma processing system may include a plasma chamber that can receive and process the substrate using plasma for etching the substrate, doping the substrate, or depositing a film on the substrate.

The plasma chamber may include one or more power transmission elements that can emit electromagnetic energy to ionize gas that is delivered via a gas delivery system. One of the power transmission elements may include an interior cavity that can propagate electromagnetic waves that may be provided by a power source. A continuous slit or opening may be along the interior cavity that provides an opening that develops an alternating potential difference that may generate an electromagnetic field that propagates into the plasma chamber. The continuous slit may include a dielectric component that may be arranged to cover at least a portion of the continuous slit or opening. The dielectric component may be configured to enable the transmission electromagnetic energy or power signal into the plasma chamber. The plasma generated by the electromagnetic energy may be used to treat a substrate on a substrate holder that may be located adjacent or near the power transmission element. In one embodiment, the electromagnetic energy may be generated by a microwave energy source that may be coupled to the interior cavity. The microwave energy may propagate through the interior cavity that emits microwave energy from the continuous slit through the dielectric component and into the plasma chamber. The size, shape, and orientation of the interior cavity, continuous slit, and the dielectric component may vary based on the processing requirements for treating the substrate. For example, the interior cavity cross section geometry may vary between circular, rectangular, or square depending on the desired plasma processing conditions.

In one embodiment, the power transmission element may be circular or round in a way that surrounds the plasma processing region or the substrate. In this way, electromagnetic energy may be distributed more evenly around the plasma processing region. This circular configuration may enable gas distribution directly opposite or above the substrate. In other embodiments, another power transmission element may be opposite or above the substrate, such that the power transmission elements may work in conjunction to control the plasma density profile near the substrate. Also, power transmission element geometry is not limited to circular or round structures. In another embodiment, the power transmission element may be a linear structure that extends across the top and/or sides of the plasma chamber. The linear power transmission element may also include a continuous slit along at least one side of the interior cavity. As in the circular embodiment, the continuous slit may also include a dielectric component that emit electromagnetic energy and isolate the interior cavity from gas that is flowed into the plasma chamber.

Generally, plasma density control for larger substrates may be difficult to accomplish. One approach may be to combine power transmission elements to increase the control of the plasma density profile. In another embodiment, the plasma chamber may include two or more circular or round power transmission elements that may be stacked above or below each other. The power transmission elements may have the same diameter or one of them may have a smaller diameter to improve plasma density control closer to the center of the substrate.

Two or more linear transmission elements may also be used together to control plasma density control in the plasma chamber. For example, the linear power transmission elements may be aligned in a parallel with each other and may be located opposite or above the substrate holder to provide plasma density control over a larger surface area that could be covered by a single linear transmission element.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention. Additionally, the left most digit(s) of a reference number identifies the drawing in which the reference number first appears.

DETAILED DESCRIPTION

The following Detailed Description refers to accompanying drawings to illustrate exemplary embodiments consistent with the present disclosure. References in the Detailed Description to "one embodiment," "an embodiment," "an exemplary embodiment," etc., indicate that the exemplary embodiment described can include a particular feature, structure, or characteristic, but every exemplary embodiment does not necessarily include the particular feature, structure, or characteristic. Moreover, such phrases are not necessarily referring to the same embodiment. Further, when a particular feature, structure, or characteristic is described in connection with an embodiment, it is within the knowledge of those skilled in the relevant art(s) to affect such feature, structure, or characteristic in connection with other exemplary embodiments whether or not explicitly described.

The exemplary embodiments described herein are provided for illustrative purposes, and are not limiting. Other embodiments are possible, and modifications can be made to exemplary embodiments within the scope of the present disclosure. Therefore, the Detailed Description is not meant to limit the present disclosure. Rather, the scope of the present disclosure is defined only in accordance with the following claims and their equivalents.

The following Detailed Description of the exemplary embodiments will so fully reveal the general nature of the present disclosure that others can, by applying knowledge of those skilled in the relevant art(s), readily modify and/or adapt for various applications such exemplary embodiments, without undue experimentation, without departing from the scope of the present disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not limitation, such that the terminology or phraseology of the present specification is to be interpreted by those skilled in relevant art(s) in light of the teachings herein.

Figure 1:
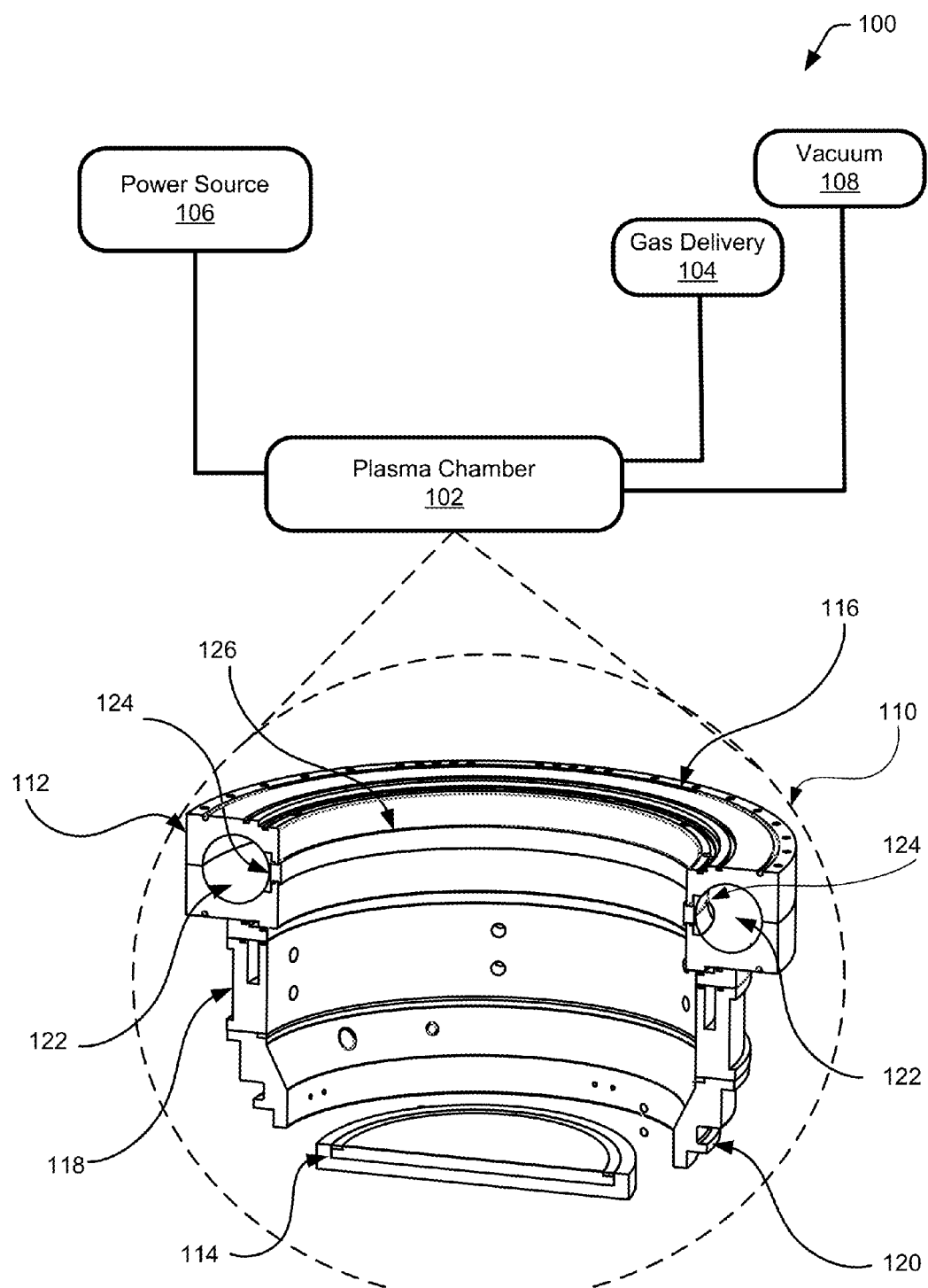
FIG. 1 is an illustration of a representative embodiment of a plasma processing system that shows a schematic cross-sectional illustration of one embodiment of a plasma chamber that includes a microwave power transmission element.

FIG. 1 depicts a plasma processing system 100 for treating substrates using plasma (not shown) that is generated in plasma chamber 102. Plasma may be generated in the plasma chamber 102 by ionizing gas that is provided by a gas delivery system 104 and exposing the gas to electromagnetic energy provided by a microwave power source 106. A vacuum system 108 may also maintain a subatmospheric pressure within the plasma chamber 102 during plasma generation.

Plasma generation may be done by applying electromagnetic energy to an electrically neutral gas to cause negatively charged electrons to be released from a gas molecule that is positively charged as result of the lost electron. Over time, the electromagnetic energy and the increasing electron collisions within the gas increase the density of ionized molecules within the gas, such that the ionized molecules may be influenced by potential differences within the plasma chamber 102. For example, the potential differences within the plasma chamber 102 may direct the ionize molecule towards a substrate (not shown). The ionized molecules (not shown) may interact with the substrate or treat the substrate in a way that may remove a portion of the substrate or may be deposited unto the substrate. In this way, patterns may be etched into the substrate or films may be deposited onto the substrate.

Plasma density across the plasma chamber 102 may impact the uniformity of the plasma treatment of the substrate. The plasma density may be a measure of ion density within a volume of the plasma within the plasma chamber 102. Plasma processing uniformity may be impacted when the plasma density varies across the substrate such that higher plasma density at the center of the substrate may cause a higher etch rate than the etch rate at the edge of the substrate. Generally, this process non-uniformity may be the result of the placement of a power transmission element near the center of a circular substrate and/or by diffusion characteristics of the plasma. One approach to resolve the non-uniformity may be to locate the power transmission element near the edge or around the edge of the circular substrate. A detailed view 110 illustrates one embodiment of this approach in the plasma chamber 102.

In one embodiment, the plasma chamber 102 may include a power transmission element 112 that may surround a substrate holder 114 that can support a substrate during plasma processing. Plasma generation may occur within the plasma chamber 102 that may include a O-ring seal 116 for a top cover plate that may cover the top of the plasma chamber 102 or another chamber attached to the top of the plasma chamber 102, an upper side wall 118, and a lower side wall 120. In other embodiments, the plasma chamber 102 enclosure may vary in size and orientation such that the substrate holder 114 may be closer to the power transmission element 112 than as shown in FIG. 1.

The power transmission element 112 may include an interior cavity 122 that may be coupled to the power source 106. In the FIG. 1 embodiment, the power transmission element 112 forms a circle around the plasma processing region or the substrate holder 114. Hence, the interior cavity 122 may propagate electromagnetic energy (not shown) around the plasma processing region or the plasma chamber 102 enclosure. The electromagnetic energy may be transmitted into the plasma chamber 102 enclosure from a continuous slit 124 that forms an opening between the interior cavity 122 and the plasma chamber 102. The continuous slit 124 may include a dielectric component 126 that isolates the interior cavity 122 from the gas in the plasma chamber 102. However, the properties of the dielectric component 126 enables electromagnetic energy to be transmitted into the plasma chamber 102 from the interior cavity 122. The interior cavity 122, the continuous slit 124, and the dielectric component 126 will be described in greater detail in the descriptions of the remaining figures.

Figure 2:
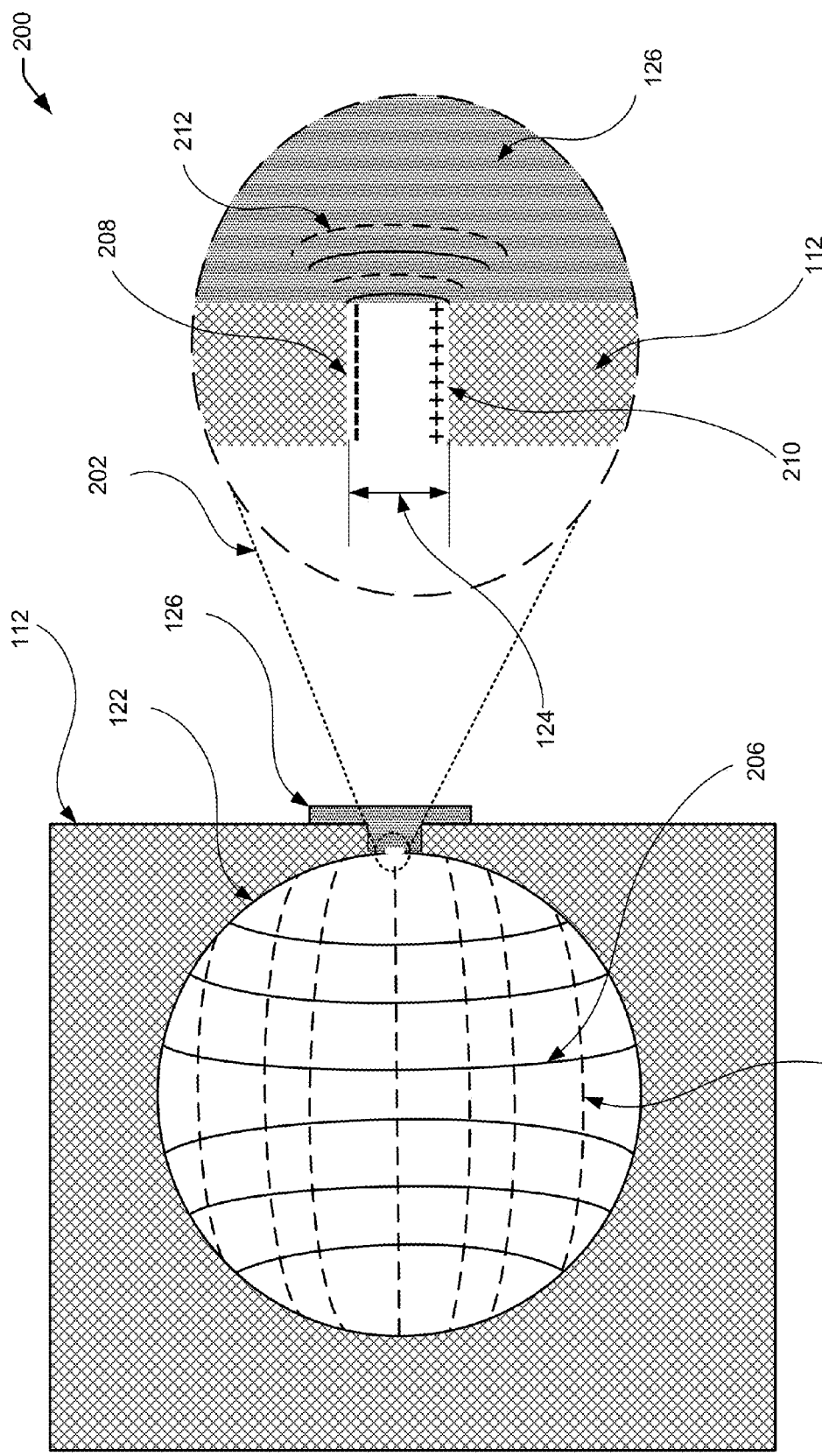
FIG. 2 is an illustration of a cross section of an exemplary interior cavity and continuous slit of a power transmission element and a representation of the electromagnetic energy transmitted through the interior cavity and emitted from the continuous slit.

The power source 106 may include, but is not limited to, a magnetron capable of generating electromagnetic energy in the radio frequency (RF) or microwave spectrum. The microwave spectrum may include electromagnetic waves with wavelengths ranging between 1 mm and 1 m and a frequency ranging between 300 MHz and 300 GHz. The RF spectrum may include electromagnetic waves with wavelengths ranging between 1 mm and 1 m and a frequency ranging between 300 kHz and 300 GHz. As shown in FIG. 2, the electromagnetic energy may be propagated through the interior cavity 122 to generate an alternating potential across the continuous slit 124 that may generate an electric field (not shown) that is emitted into the plasma chamber 102.

FIG. 2 is a cross-sectional illustration 200 of an exemplary interior cavity 122 and continuous slit 124 of a power transmission element 112. The illustration 200 also depicts a representation of the electromagnetic energy transmitted through the interior cavity 124 and emitted from the continuous slit 124 through the dielectric component 126. The exploded view 202 of the continuous slit 124 and dielectric component 126 is intended to explain the transmission of electromagnetic energy from the power transmission element 112 into the plasma chamber 102 enclosure.

The illustration 200 is intended to represent a static two-dimensional representation of electromagnetic energy comprising a magnetic field 204 and an electric field 206 in a transverse oscillating wave (not shown) propagating through the interior cavity 122 (e.g., propagating out of the FIG. 2 page). The dashed substantially horizontal magnetic field lines 204 represent the oscillation of the magnetic field as it propagates through the interior cavity 122. The solid substantially vertical electric field lines 206 represent the oscillation of the electric field as it propagates through the interior cavity 122.

The electromagnetic wave propagation through the interior cavity 122 may induce a potential difference across the continuous slit 124. For purposes of explanation, a negative charged surface 208 may be formed on the upper portion of the continuous slit 124 and a positively charged surface 210 on the lower portion of the continuous slit 124. However, the potential difference across the continuous slit 124 may also oscillate as the surface charge changes in concert with the change in current flow. The potential difference may generate an electromagnetic field 212 that may propagate through the dielectric component 126 and into the plasma chamber 102. The energy from the electromagnetic field 212 may separate electrons from their respective gas molecules and form ionized molecules (e.g., plasma) that may be used to treat the substrate.

In the FIG. 2 embodiment, the interior cavity 122 cross section is shown as circular. However, in other embodiments the cross section geometry of the interior cavity can vary in structure and size. For example, the interior cavity 122 cross section may be square or rectangular. Regardless of cross section geometry, the principles of electromagnetic propagation may still apply, but the geometry may impact the characteristics or mode of the electromagnetic wave propagating in the interior cavity 122 and the electromagnetic field 212 transmitted into the plasma chamber 102. A rectangular embodiment will now be described in the description of FIG. 3.

Figure 3:
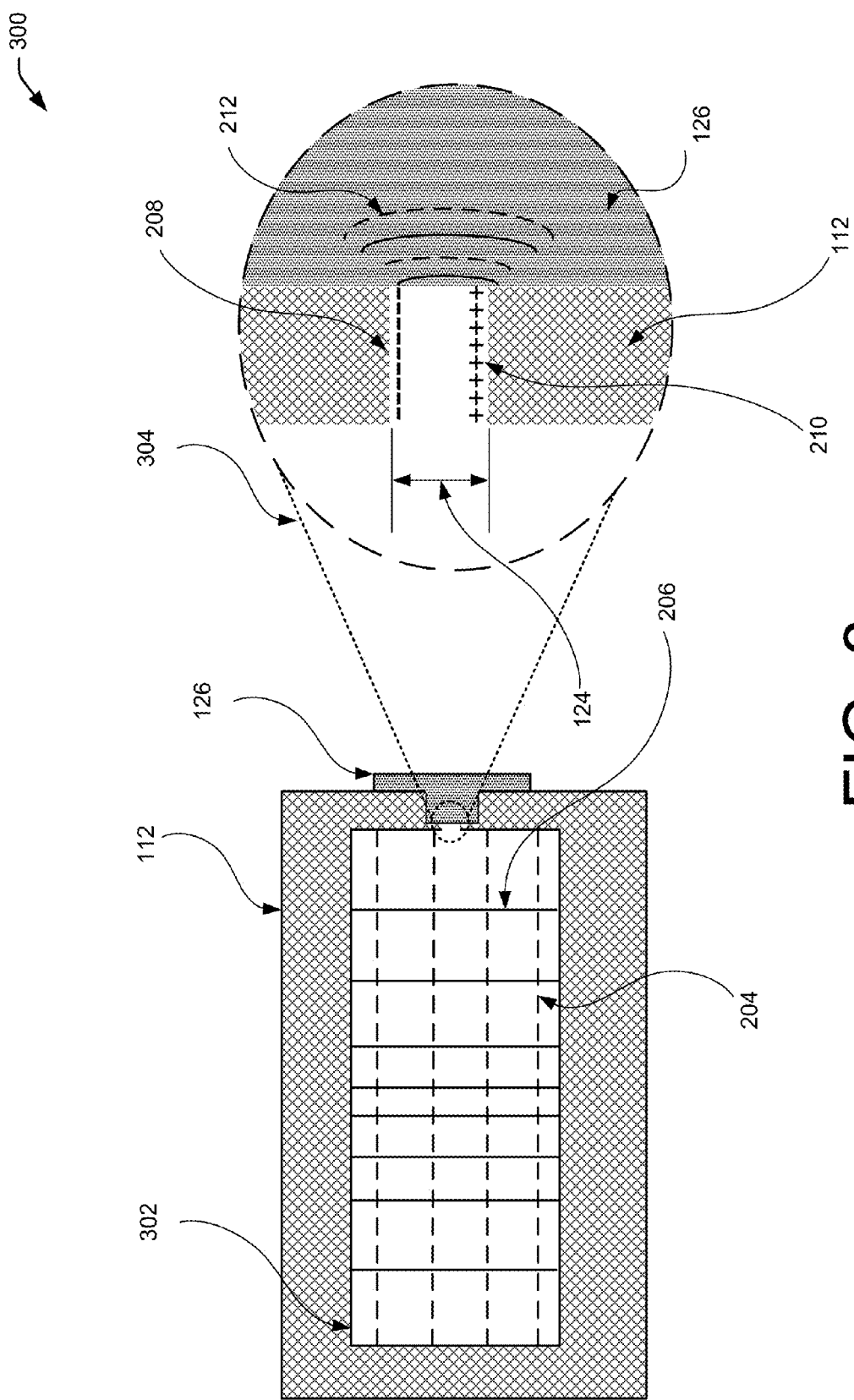
FIG. 3 is another illustration of a cross section of another exemplary interior cavity and continuous slit of a power transmission element and a representation of the electromagnetic energy transmitted through the interior cavity and emitted from the continuous slit.

FIG. 3 is a cross-sectional illustration 300 of a rectangular interior cavity 302 and continuous slit 124 of a power transmission element 112 along with a representation of the electromagnetic energy transmitted through the interior cavity 302 and emitted from the continuous slit 124. Again, the power source 106 may be coupled to the interior cavity 302 and propagate electromagnetic energy as represented by the magnetic field lines 204 and the electric field lines 206. Consequently, the oscillating potential difference across the continuous slit 124 may generate an electromagnetic field 212 that may be transmitted through the dielectric component 126 and into the plasma chamber 102 enclosure. The exploded view 304 of the continuous slit 124 and dielectric component 126 is intended to explain the transmission of electromagnetic energy 212 from the power transmission element 112 into the plasma chamber 102 enclosure.

FIG. 3 is intended to show that the electromagnetic wave propagation is not limited to a specific geometry for the interior cavity. The geometry may be circular (as shown in FIG. 2), rectangular, square, or any other geometric shape that may include a one or more continuous slits 124 that provide an opening between the interior cavity 302 and the plasma chamber 102 enclosure. In this way, the power transmission element 112 may enable a distribution of electromagnetic energy throughout the plasma chamber 102. The circular power transmission element 112 is merely one energy distribution embodiment, as shown in FIG. 4.

Figure 4:
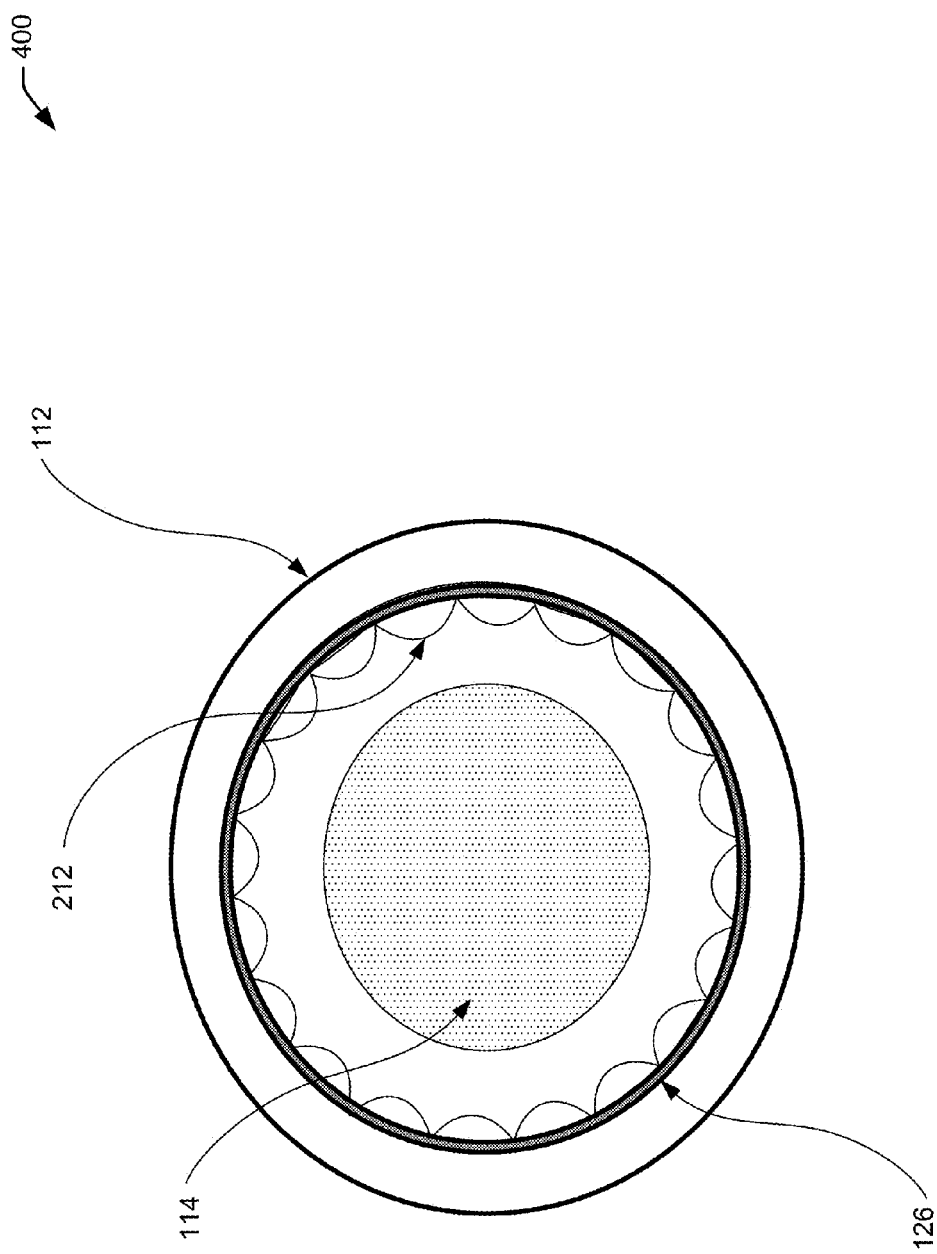
FIG. 4 is a top view illustration of the plasma chamber shown in FIG. 1 that highlights the electromagnetic energy emitted from the power transmission element.

FIG. 4 is a top view illustration 400 of the plasma chamber 102 that does not include the top plate for the purpose of showing the structure of the power transmission element 112 relative to the substrate holder 114 and the electromagnetic energy (e.g., electromagnetic field 212) emitted from the dielectric component 126. In this embodiment, the power transmission structure 112 may be formed around the substrate holder 114 or a plasma processing region proximate to the substrate holder 114. The power transmission element 112 may be circular or substantially circular (e.g., round or elliptical) to provide an electromagnetic field 212 that may ionize gas that is introduced into the plasma chamber 102. The gas may be introduced above, below, or above and below the power transmission element 112.

The distribution of the pattern of the electromagnetic field 212 may be driven by, but is not limited to, transverse electric modes (TE), transverse magnetic modes (TM), transverse electromagnetic modes (TEM), or hybrid modes. The modes are used to classify or identify the types of the electromagnetic waves based on a plane that is perpendicular to the propagation direction of the wave (e.g., electric or magnetic). TE waves are electromagnetic waves that do not have an electric field in the direction of propagation. TM waves are electromagnetic waves that do not have a magnetic field in the direction of propagation. TEM waves are electromagnetic waves that do not have an electric or magnetic field in the direction of propagation.

Waves may also be classified by the type and the number of modes in their pattern, such as $TE_{11}$ or $TE_{10}$. The lower field strength regions may be responsible for the lower magnitude portions of the electromagnetic field 212 and are illustrated, in the top view, by the oscillation of electromagnetic field 212 around the power transmission element 112. The lower field strength may be represented by the portion of the electromagnetic field 212 that is closest to the dielectric component 126, as shown in the top view illustration 400. Although one mode is illustrated in FIG. 4, the power transmission element 112 is not limited to any mode type or number and may be used to propagate any of the modes and associated variations.

In another embodiment, the power transmission element 112 may be linear or substantially linear, such that the power transmission element 112 may be placed opposite or above the substrate holder 114 coupled to or in lieu of the top plate. This is in contrast to the FIG. 4 embodiment that shows the power transmission element surrounding the substrate holder 114. The linear power transmission element (not shown) comprises a linear interior cavity (not shown) that may have cross section geometry of one or more of the following: circular, rectangular, or square. The linear power transmission element may also have a continuous slit (not shown) along one of the surfaces that provides an opening between the interior cavity and the plasma chamber 102 enclosure. A dielectric component (not shown) may also be used to cover the slit to isolate the interior cavity from the plasma chamber 102 enclosure. In certain instances, the circular and linear power transmission elements 112 may be used together to generate plasma above the substrate holder 114. The circular power transmission element 112 may surround the edge of the substrate holder 114 and one or more linear power transmission elements may be disposed above or opposite from the substrate holder 114. The dielectric component of the linear power transmission element is opposite or facing the substrate holder 114. In this way, the plasma density control resolution may extend over a larger area when both power transmission elements are used concurrently.

In addition to the combination of the power transmission elements, the electromagnetic field 212 profile may also be impacted by the design of the interior cavity 122, the location and design of the continuous slit 124, and the design of the dielectric component 126. A few examples are illustrated in FIGS. 5A-5B.

Figure 5A:
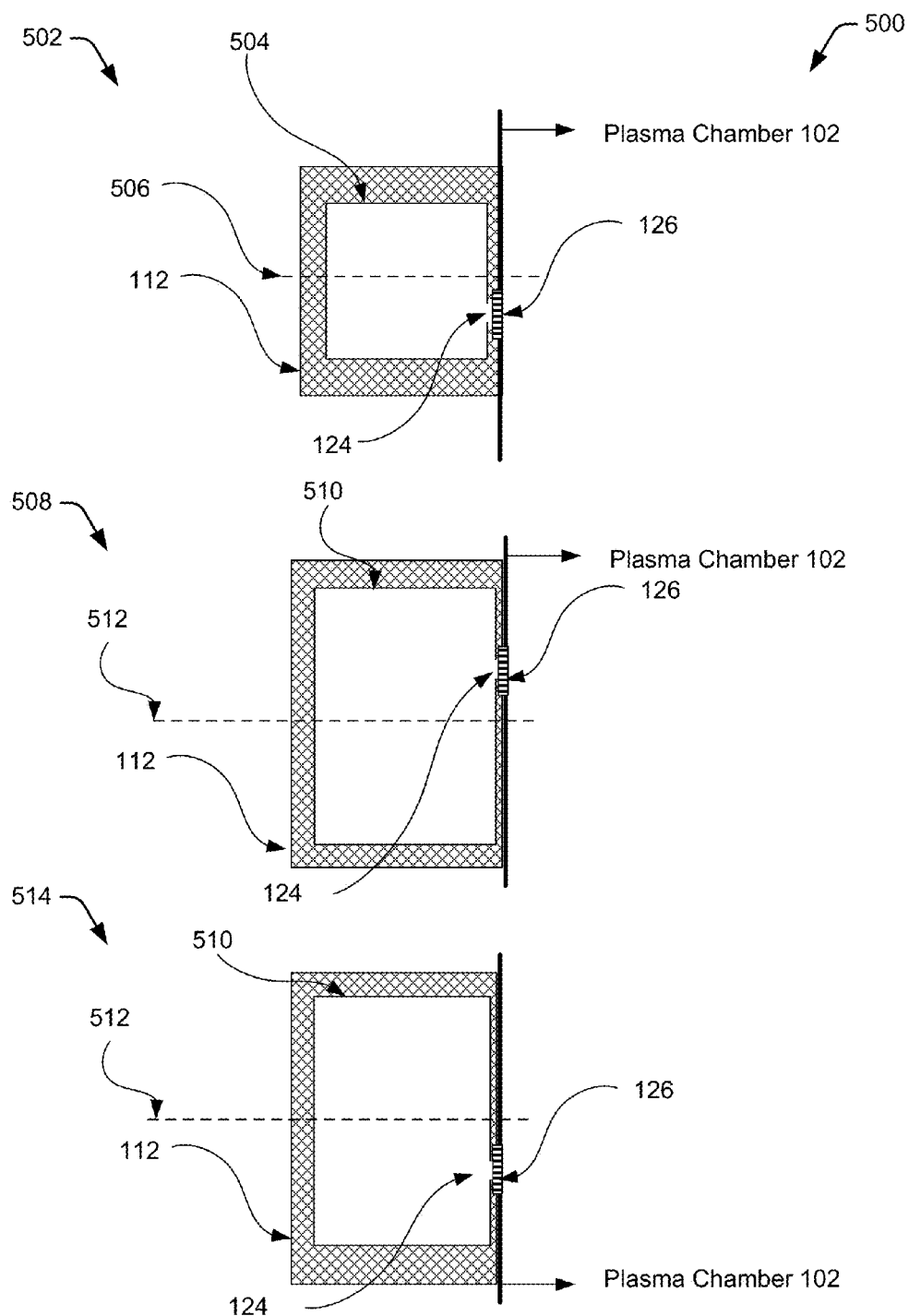
FIGS. 5A-5C includes schematic cross-sectional illustrations of several embodiments of the power transmission element and the continuous slit.
Figure 5B:
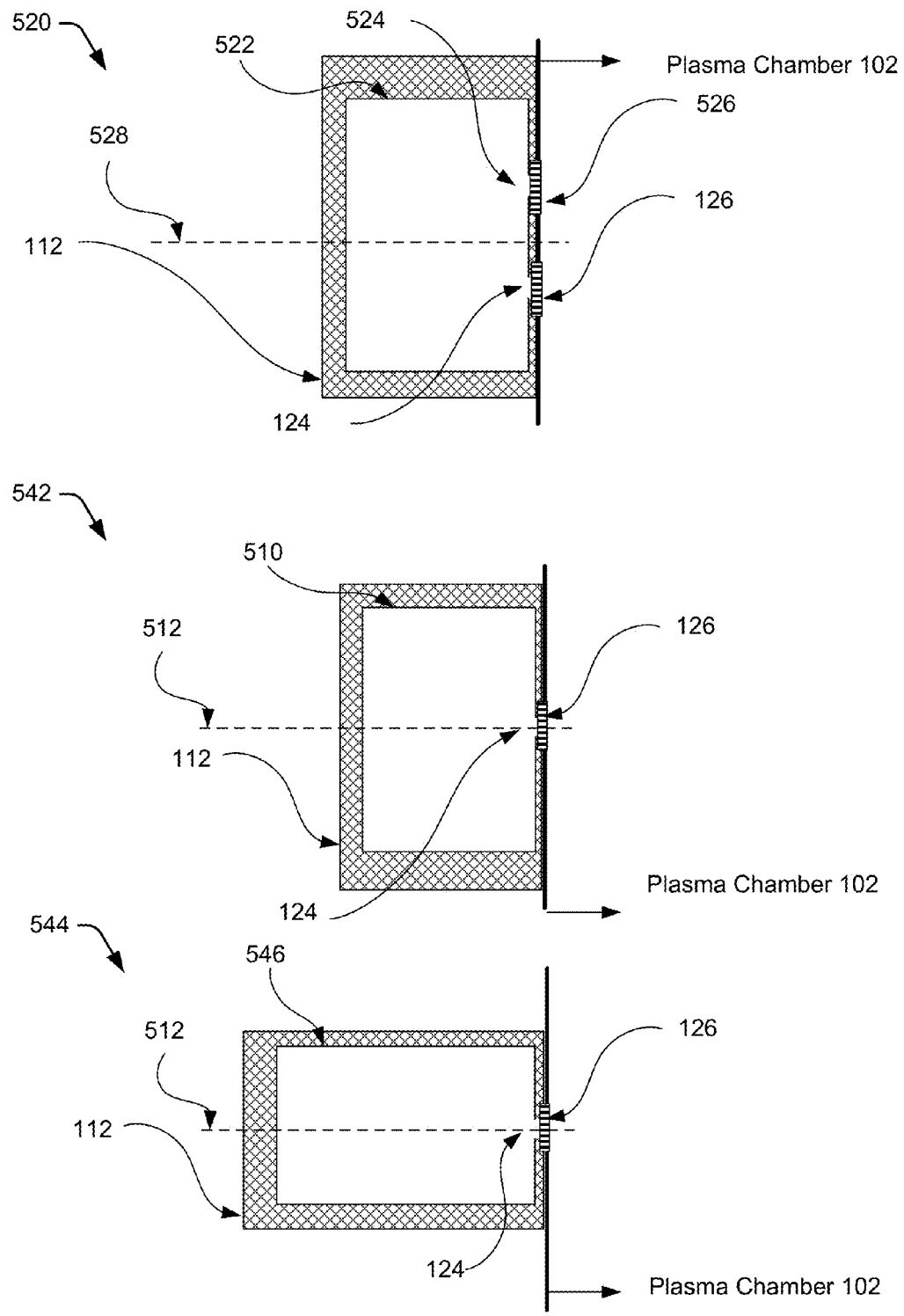
Figure 5C:
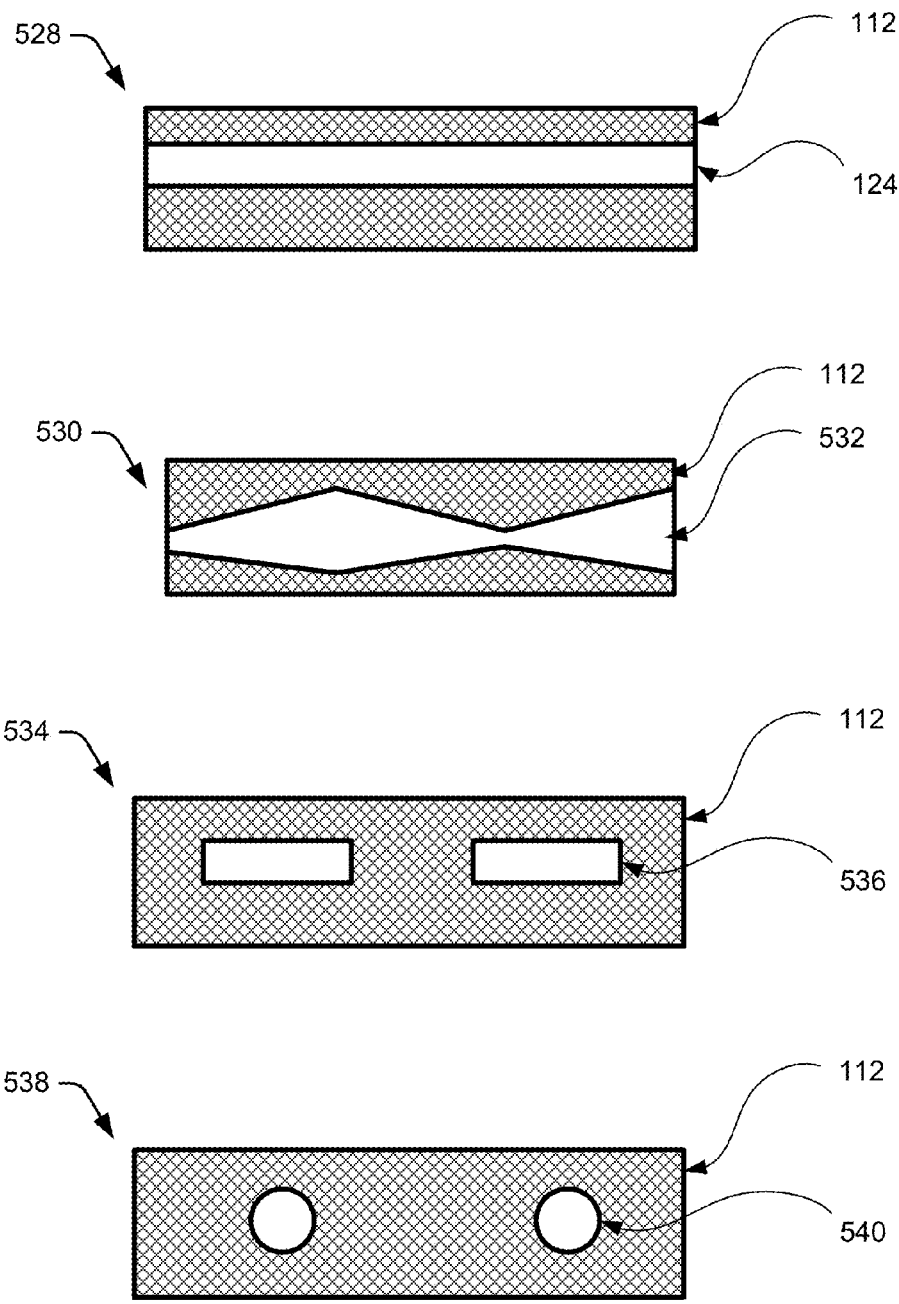

FIGS. 5A-5C includes schematic cross-sectional illustrations 500 of several embodiments of the power transmission elements 112 related to the interior cavity 122 and the continuous slit 124. The magnitude of the electromagnetic field 212 being emitted from the power transmission element 112 may be dependent upon the geometry of the interior cavity 122 and the location and size of the continuous slit 124. The geometry of the interior cavity 122 may impact the shape of the propagating electromagnetic wave in a way that dictates the maximum magnitude may be located at certain areas of the interior cavity 122. Accordingly, the continuous slit 124 may, but is not required to, be located near those areas to increase the efficiency of generating the electromagnetic field 212 from the electromagnetic energy provided by the power source 106. In FIGS. 5A & 5B, four embodiments are described that may optimize the electromagnetic field 212 generation efficiency, however the scope of the claims should not be limited to these illustrated embodiments. For example, the continuous slit 124 may also be located along the center line of the interior cavity 504 or 510. In FIG. 5C, several embodiments for slit design for the power transmission element 112 are illustrated.

In FIG. 5A, the square embodiment 502 may include a power transmission element 112 that includes an interior cavity 504 that has a square cross-sectional geometry. As the electromagnetic wave propagates through the interior cavity 504, the electric field 206 of the wave may reach a higher magnitude when the wave is farther away from the centerline 506 of the interior cavity 504. Hence, the continuous slit 124, along with the dielectric component 126, may be located above or below the centerline 506. However, in other embodiments, the continuous slit may also be located along the centerline 506.

The first rectangular embodiment 508 may include a power transmission element 112 that includes an interior cavity 510 that has a rectangular cross-sectional geometry. A rectangle may be classified as an object that either longer than it is wide or wider than it is high. As the electromagnetic wave propagates through the interior cavity 510, the electric field 206 of the wave may vary its magnitude when the wave is farther away from the centerline 512 of the interior cavity 510. Hence, the continuous slit 124, along with the dielectric component 126, may be located above or below or at the centerline 512. The first rectangular embodiment 508 has the continuous slit 124 above the centerline 512 while the second rectangular embodiment 514 has the continuous slit 124 below the centerline 512. In this way, the second rectangular embodiment 514 may use a different magnitude of the electric field 206 that is below the centerline 512. However, in other embodiments, the continuous slit 124 may also be located along the centerline 512, as shown in the centerline embodiments 542, 544 in FIG. 5B.

In FIG. 5B, a dual slit embodiment 520 is a variation of the single slit embodiments described above in the descriptions of FIG. 5A. In this instance, the rectangular interior cavity 522 has a first continuous slit 124 and a second continuous slit 524 that each provide an opening from the interior cavity 522 to the plasma chamber 102, the openings being covered by their respective dielectric components 126, 526 or a single dielectric component (not shown) that covers both the first continuous slit 124 and the second continuous slit 524. In this instance, the first continuous slit 124 is below the centerline 528 and the second continuous slit 524 is above the centerline 528.

The third rectangular embodiment 542 may include a power transmission element 112 that includes an interior cavity 510 that has a rectangular cross-sectional geometry. A rectangle may be classified as an object that either longer than it is wide or wider than it is high. As the electromagnetic wave propagates through the interior cavity 510, the electric field 206 of the wave may peak proximate to the centerline 512 of the interior cavity 510. Hence, the continuous slit 124, along with the dielectric component 126, may be located at the centerline 512. In the fourth rectangular embodiment, the interior cavity 544 has the continuous slit 124 in the short side of the rectangular cavity. In this embodiment, the continuous slit is also aligned along the center line 512 that may coincide with the peak value of the wave propagating through the interior cavity 546.

The size of the interior cavity 522 may vary depending upon the operating frequency range of the power source 106 and the dielectric material filling the interior cavity 112. The operating frequency of the power source 106 may vary between 300 MHz to 300 GHz. An interior cavity 520 with a rectangular cross section may vary between 0.8 mm to 600 mm high and 0.4 to 300 mm wide. In another embodiment, the interior cavity 522 may vary between 50 mm to 200 mm and 20 mm to 100 mm. In one specific embodiment, the interior cavity 522 may be approximately 137 mm high and approximately 69 mm wide when using a microwave signal operating at a frequency of approximately 2.45 GHz. In another specific embodiment, the interior cavity 522 may be approximately 96 mm high and approximately 27 mm wide when using a microwave signal operating at a frequency of approximately 2.45 GHz.

In a circular cross section embodiment, the interior cavity 112 filled with gas may have a diameter of less than 400 mm in view of the power source's 106 operating frequency range of 800 MHz to 5 GHz. In one specific embodiment; the diameter of the interior cavity 112 may be approximately 80 mm when the operating frequency of the power source 106 is approximately 2.45 GHz.

In addition to the interior cavity 522 and location of the continuous slit 124, the design of the continuous slit 124 may play a role with the propagation of the electromagnetic field 212 into the plasma chamber 102. The slit design may vary depending, at least in part, on the power, frequency, and mode of the electromagnetic wave being propagated through the power transmission element 112. The FIG. 5C embodiments are drawn from the point of view of looking at the power transmission element from inside the plasma chamber 102, in contrast to the other drawings in FIGS. 5A & 5B that are cross sections.

In FIG. 5C, the straight continuous slit embodiment 528, as shown in FIG. 1, may enable the use of a wide range of electromagnetic wave configurations without changing the hardware configuration of the power transmission element 112. For instance, the continuous slit 124 may enable the use of different wave modes, as discussed in the description of FIG. 4, without reconfiguring or making changes to the interior cavity 122. However, in certain instances, the dielectric component 126 may be changed to account for different configurations of electromagnetic waves that may be used to strike plasma in the plasma process chamber 102. An example of the straight slit embodiment 528 is shown in FIG. 5B, the slit gap distance may vary between 0.5 µm and 50 mm, however in certain embodiments the slit gap distance may be less than 3 mm Although the continuous slit 124 shown FIG. 1 to be a substantially straight line, the continuous line is not required to be straight and may vary horizontally and vertically between the centerline 512 and the top or bottom of the power transmission element 112 in the square interior cavity embodiment 502 or one of the rectangular interior cavity embodiments 508, 514. The gap distances may also apply to non-linear slits as shown in the jagged line embodiment 530. The gap distance of the jagged line embodiment 530 may be constant as shown in FIG. 5B, but is not required to constant and may vary along the power transmission element 112. In this way, portions of the jagged line embodiment 530 may have a gap distance of 0.5 µm and other portions may have a gap distance of greater than 0.5 µm. Although the frequency between the peaks and valleys of the jagged continuous slit 532 are shown to be constant, in other embodiments the peak and valley frequency may vary along the power transmission element 112. The varying gap distances may enable different magnitudes of power transmission from the electromagnetic wave propagating in the power transmission element 112. For example, the power magnitudes may be higher in the regions of higher gap distance compared to the regions with relatively smaller gap distances. In certain embodiments, the frequency of the larger and smaller gap distances may be reflected in the modes being propagated through the power transmission element 112. The larger or smaller gap distances may reflect the locations of the modes, such that the different gap distances facilitate the suppression or transmission electromagnetic energy based on mode location. Likewise, the slot embodiment 534 and hole embodiment 538 may also be positioned on the power transmission element 112 based, at least in part, on the mode of the propagating electromagnetic wave.

Figure 12:
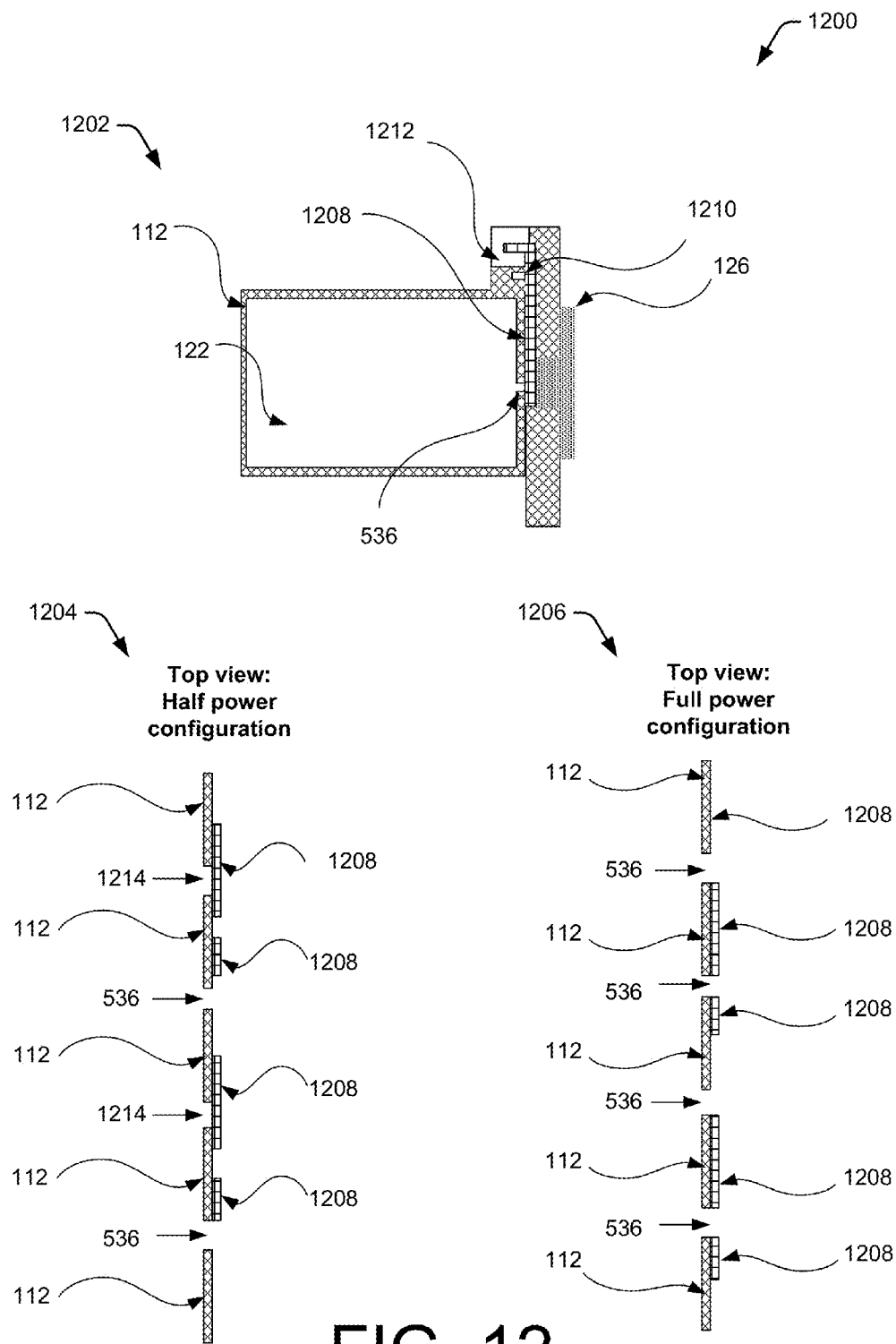
FIG. 12 is a two-dimensional cross section illustration of the power transmission element comprising overlapping slots that can vary the amount of power emitted from the power transmission element.
Figure 13:
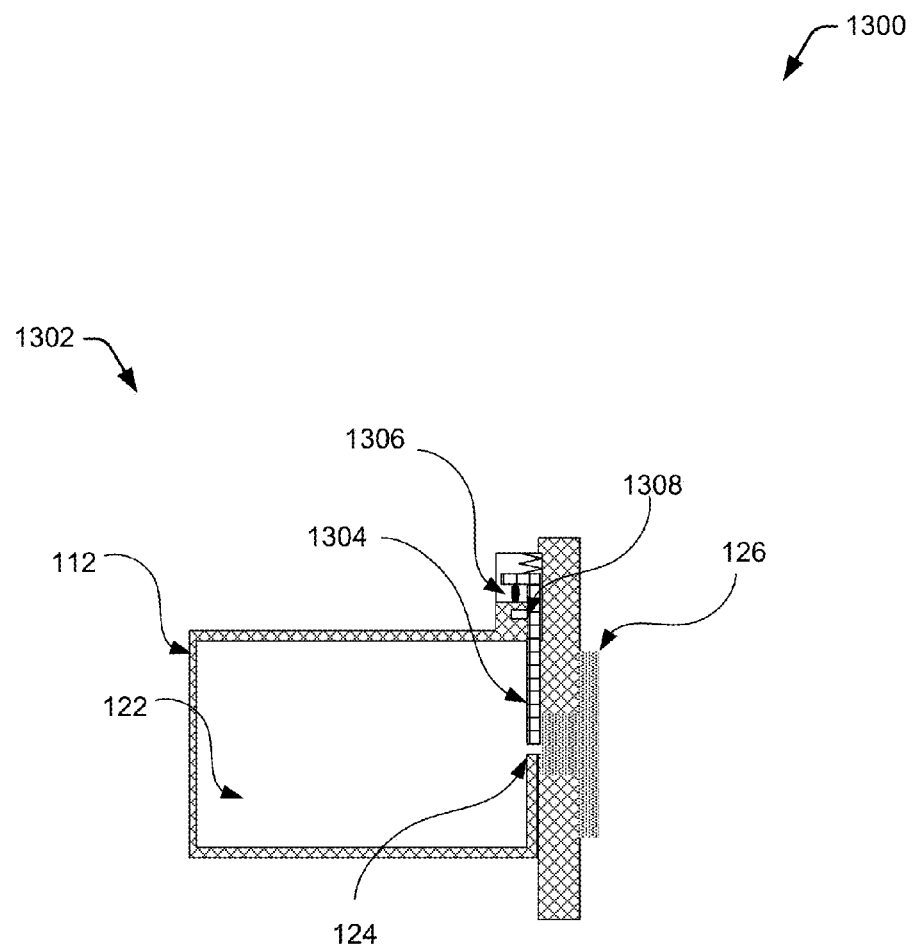
FIG. 13 is a two-dimensional cross section illustration of the power transmission element comprising an adjustable wall that can vary the amount of power emitted from the power transmission element.

In the slot embodiment 534, a plurality of rectangular slits 536 may be positioned around the power transmission element to facilitate plasma generation in the plasma process chamber 102. The rectangular slits 536 may be positioned to accommodate one or more modes of electromagnetic waves; hence the number of rectangular slits 536 may not be required to match the number of modes and may include more or less rectangular slits 536 than the mode number. However, in one specific embodiment, the quantity of the rectangular slits 536 may match the mode number and may appropriately distributed across the power transmission element. In the description of FIGS. 12 & 13, several techniques will be described on how to vary the amount of rectangular slits 536 automatically without replacing or swapping out the entire power transmission element 112.

The hole embodiment 538 may be similar in concept to the slot embodiment 534, except that the geometry of the slit may be substantially circular or elliptical. The circular slit 540 is illustrated in FIG. 5C and the diameter of the hole may vary in a similar manner as described in the continuous slit embodiment 528.

Another design feature for the interior cavity 122 may include altering the wave propagation medium of the interior cavity 122. Electromagnetic waves may propagate through a low vacuum environment or through a liquid or a solid medium. In the low vacuum embodiment, the dielectric component 126 may isolate the interior cavity 122 from process gases in the plasma chamber 102. However, the propagation medium may also be a solid material that fills or at least substantially fills the interior cavity 122. The solid medium may impact the characteristics of the electromagnetic wave and may also prevent process gases from interfacing with or degrading the interior cavity's 122 surface. The propagation medium may include, but is not limited to, an inert gas (e.g., Ar, N2, etc.), quartz, liquid, or ceramic materials. The solid propagation mediums may be designed to interface with the dielectric component 126 or may be used to replace the dielectric component 126. The interface may include an air gap or a surface of the dielectric component 126 may be substantially flush with the surface of the solid propagation medium. The dielectric component 126 may also have an impact on the propagation of the electromagnetic field 212. In one specific embodiment, the solid propagation medium may be continuous with the dielectric component 126. In that the continuous embodiment may be a single part that forms the solid propagation medium and the dielectric component 126. They may be in contrast to the substantially flush embodiment in which the solid propagation medium and the dielectric component may be two distinct parts made of the same or similar material or even dissimilar materials.

Figure 6A:
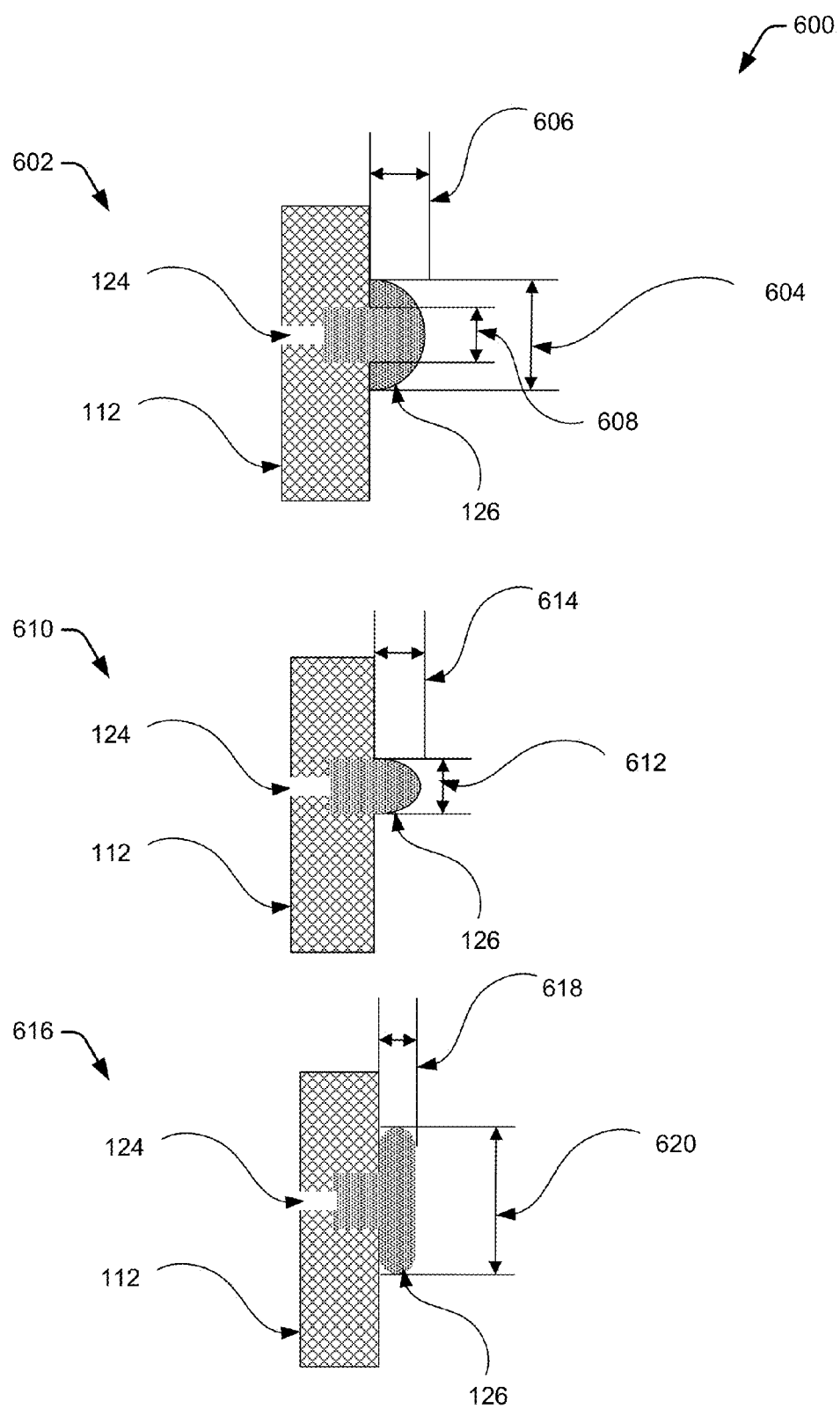
FIGS. 6A & 6B include illustrations of various embodiments of the dielectric component that may cover the continuous slit of the power transmission element.
Figure 6B:
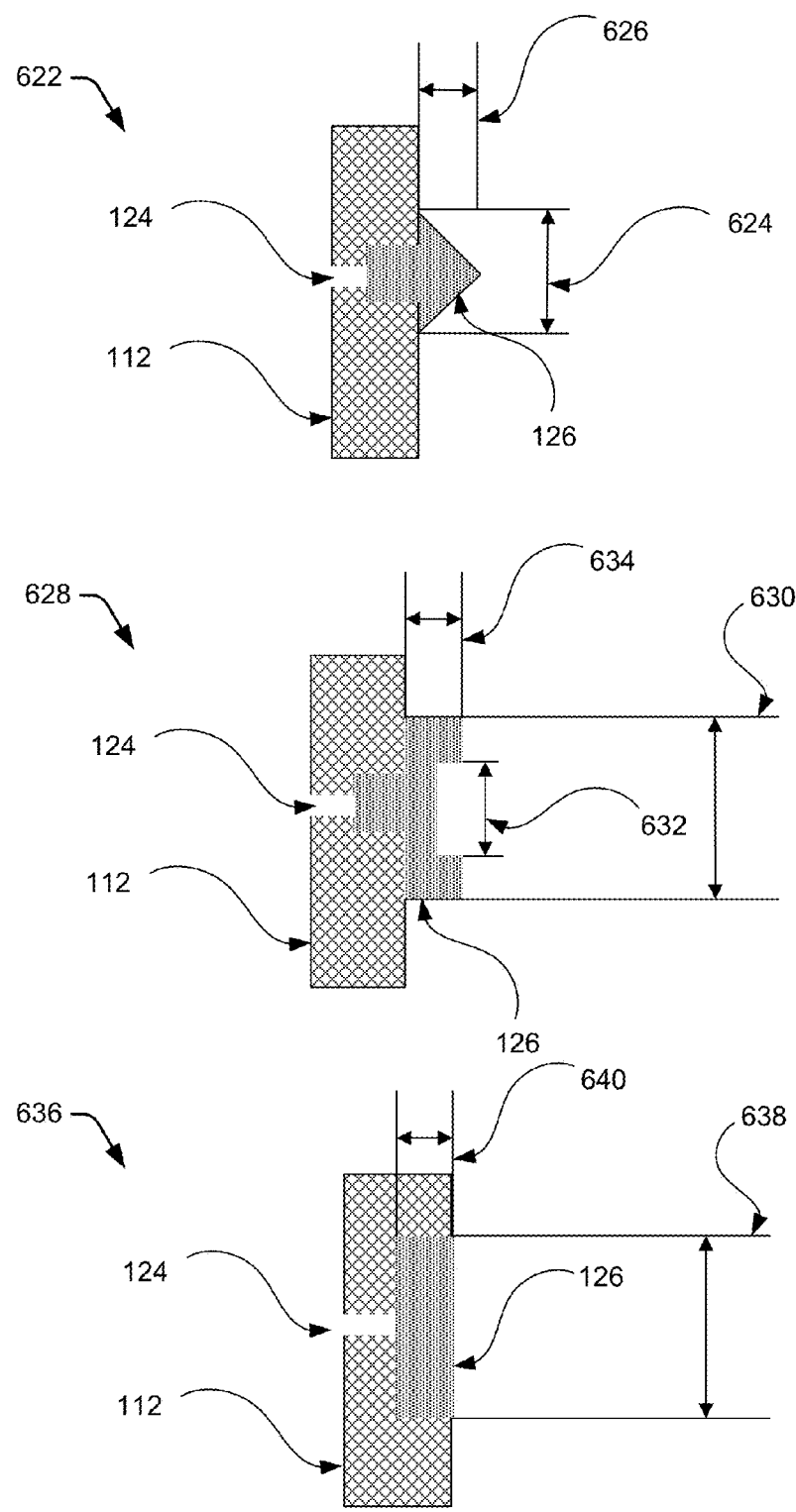

FIGS. 6A-6B includes illustrations 600 of various embodiments of the dielectric component 126 that may cover at least a portion of the continuous slit 124 of the power transmission element 112. The dielectric component 126 may be used to isolate the interior cavity 122 from the process gas in the plasma chamber 102. The isolation may include creating a vacuum seal (not shown) between the power transmission element 112 and the dielectric component 126. The vacuum seal may include o-rings or other mechanical means to secure the dielectric component 126 to the power transmission element 112 and to limit the gas flow rate between the interior cavity 122 and the plasma chamber 102. In some embodiments, the dielectric component 126 may also protect the sidewall of the power transmission element 112 from reactive gases used during plasma processing. The dielectric component 126 may also be shaped to optimize the electromagnetic wave emission from the continuous slit 124 into the plasma chamber 102 enclosure. The dielectric component 126 may be made of, but is not limited to, quartz, silicon carbide, aluminum nitride, ceramic, or Polytetrafluoroethylene. FIGS. 6A and 6B illustrate only six examples of the shapes that may be used, but the scope of the claims are not limited to these six examples.

In the first illustration, the overlap embodiment 602, a portion of the dielectric component 126 may extend into the plasma chamber 102 and overlap the surface area proximate to the continuous slit 124. The overlap distance 604 may be larger than the gap distance of the continuous slit 124. The overlap distance 604 may extend up to 60 mm across the surface area proximate to the continuous slit 124. In this embodiment, the plasma chamber 102 side of the dielectric component 126 may be circular with a radius comparable to approximately half of the overlap distance 604. The radius being measured from approximately the center of the wall distance 608 portion of the continuous slit 124. In other embodiments, the circular portion of the dielectric component may have an elliptical shape (not shown) instead of a substantially circular shape. The protrusion distance 606 for the dielectric component 126 may be up to 30 mm. The protrusion distance 606 being how far the dielectric component protrudes from the surface of the power transmission element 112 into the plasma chamber 102 enclosure. The wall distance 608 of the dielectric component 126 may be the vertical thickness of the dielectric component that may be embedded into the power transmission element 112. Generally, the wall distance 608 may be larger than the gap distance of the continuous slit 124 as shown the overlap embodiment 602.

In the overlap embodiment 602, the protrusion distance 606 is substantially similar to the circular radius; however the protrusion distance 606 may be less when the shape of the protrusion becomes more elliptical than circular. In other embodiments, the overlap distance 604 may be reduced until the overlap distance is substantially similar to the gap distance of the continuous slit 124, as shown in the non-overlap embodiment 610. The non-overlap embodiment 610 may include a protrusion distance 614 may also extend up to 30 mm. The shape of the protrusion is shown to be circular, but may also be elliptical. The non-overlap distance 612 may be similar to the thickness of a portion of the dielectric component 126 that extends into the power transmission element 112.

The elliptical embodiment 616 may include a protrusion distance 618 that is different from the overlap distance 620, such that the dielectric component forms an elliptical protrusion instead of substantially circular protrusion. The protrusion distance 618 may be less than 30 mm and the overlap distance may be less than 60 mm. The difference between the protrusion distance 618 and the overlap distance 620 may result in a substantially flat surface that may be substantially perpendicular to the propagation of the electromagnetic field 212. In other embodiments, the substantially flat surface may be more concave or convex than illustrated in the elliptical embodiment 616.

The angular embodiment 622, in FIG. 6B, may include an angular protrusion distance 626 and an angular overlap distance 624. The angular protrusion distance 626 may be less than 30 mm and the angular overlap distance 624 may be less than 60 mm. The angular embodiment 622 may include a constant triangular cross section along the entire distance of the dielectric component. Alternatively, the cross section may have gaps such that pyramid like shapes are distributed along the length of the dielectric component 126.

The concave embodiment 628 incorporates a dielectric component 126 that may include a center region that is recessed from an outer region of the dielectric component. In the illustrated embodiment 628, the edges of the dielectric component show ninety degree angle edges, however the angles may be less than fifty degrees or the edges may have a radius of curvature or a chamfer in lieu of the sharp angles. Hence, the concave overlap distance 630, concave distance 632, and the concave protrusion distance 634 are not required to be measured exclusively between opposing ninety degree surfaces of the dielectric component 126. The concave cross section may extend along the length of the dielectric component 126.

The dimensions of the concave embodiment 628 may vary widely depending on the application. The concave overlap distance 630 may be up to 60 mm, the concave distance 632 may be at least slight less than the given concave overlap distance 630, and the concave protrusion distance 634 may be less than 30 mm.

The flush embodiment 636 incorporates a dielectric component 126 that is substantially flush with the exterior surface of the power transmission component 112. The flush overlap distance 638 may not include a portion of the dielectric component 126 that extends away from the opening or pocket in which the dielectric component 126 sits. The flush overlap distance 638 may be less than or equal to 60 mm. The flush protraction distance 640 includes the distance between the exterior surface of the dielectric component 126 and continuous slit 124. The flush protraction distance 640 may be less than or equal to 30 mm.

Figure 7A:
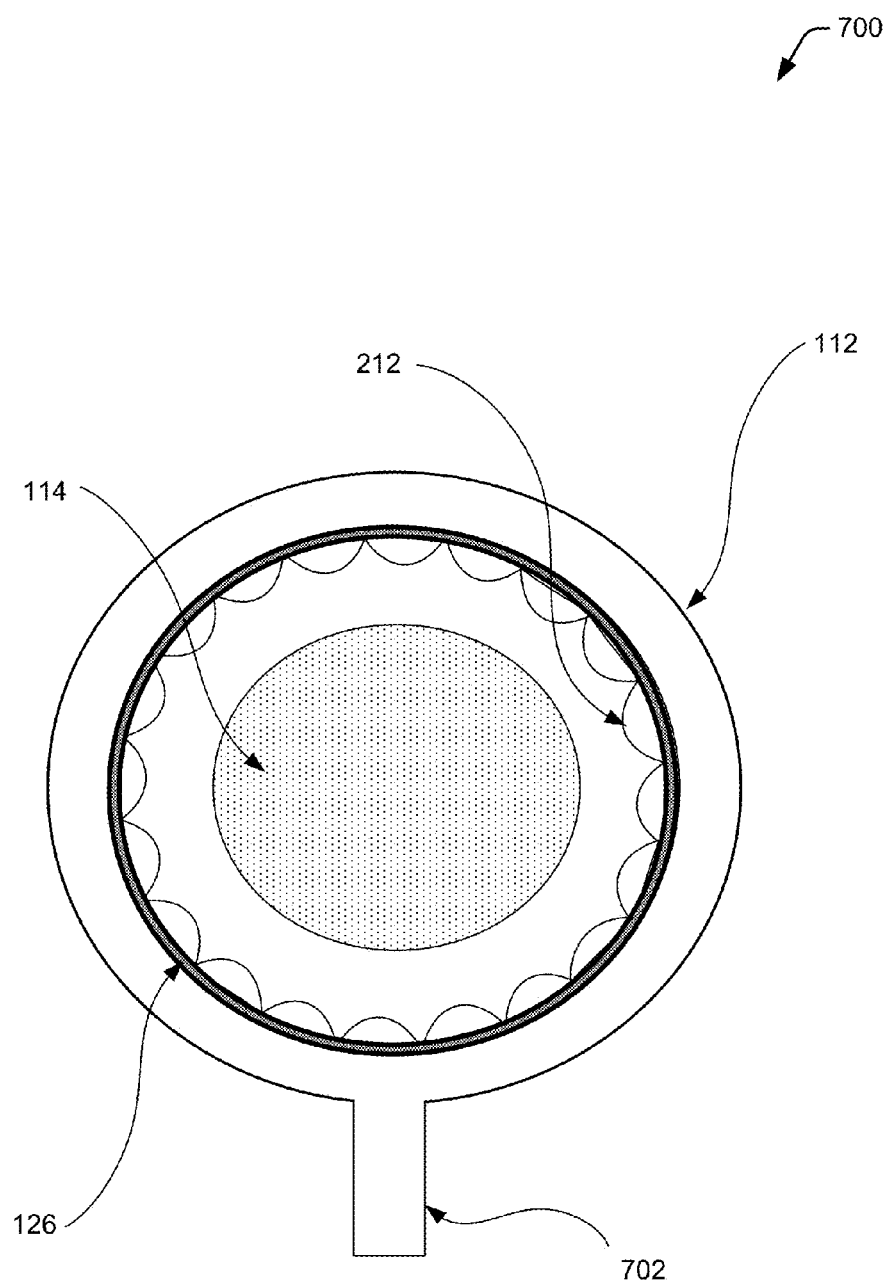
FIGS. 7A-7C include top view illustrations of the plasma chamber shown in FIG. 1 and several embodiments related to coupling a power source to the interior cavity of the power transmission element.
Figure 7B:
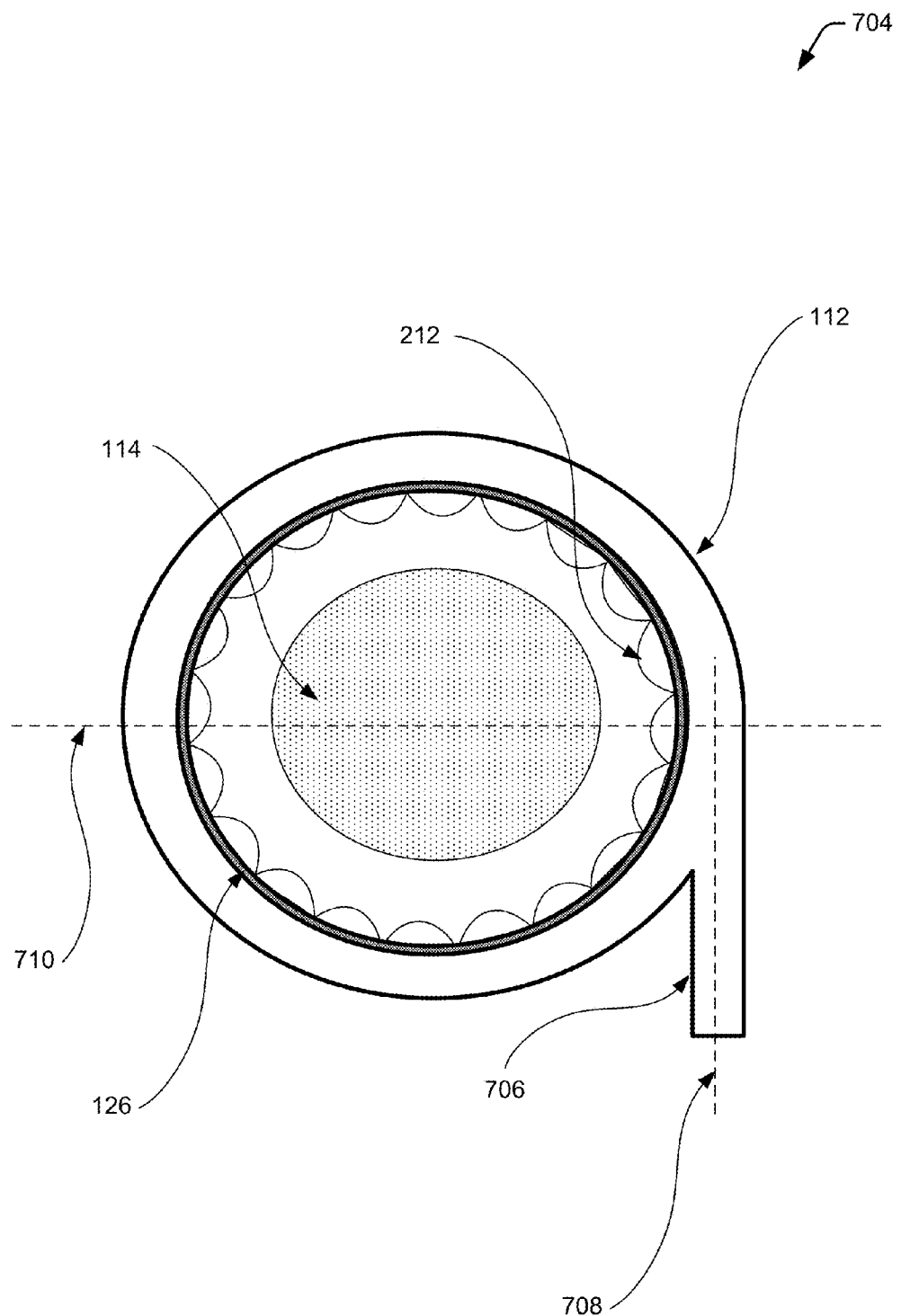
Figure 7C:
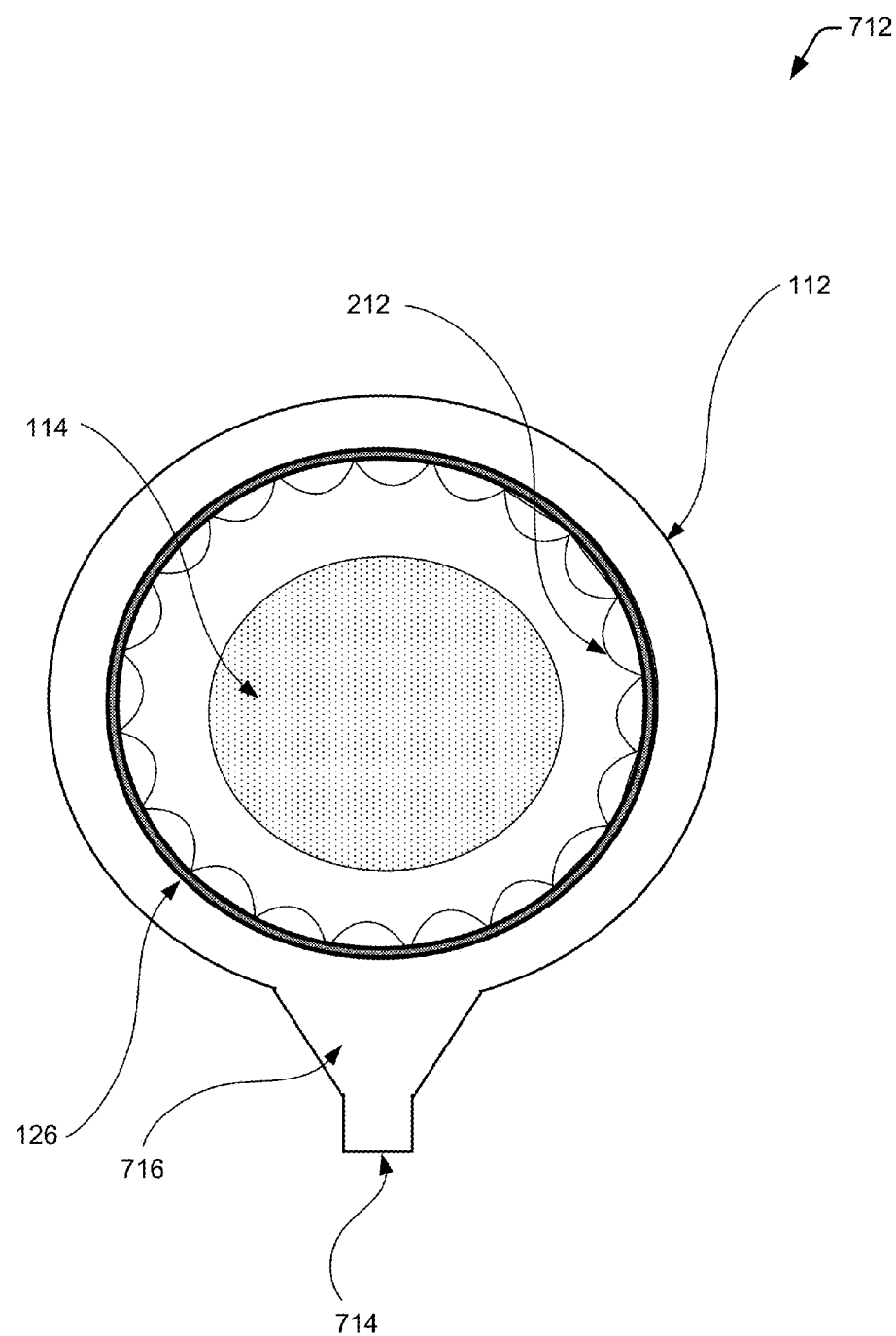

FIGS. 7A-7C include top view illustrations of the plasma chamber 102 shown in FIG. 1 and several embodiments related to coupling a power source 106 to the interior cavity 122 of the power transmission element 112. FIGS. 7A-7C also show the relative position of the dielectric component 126 (or continuous slit 124), the substrate holder 114, and the electromagnetic field 212.

The power source 106 (not shown) may provide electromagnetic energy that may be used to generate the electromagnetic field 212 that ionizes the process gas to form plasma for substrate processing. The placement, orientation, and configuration of the coupling 702 may be varied to facilitate electromagnetic energy uniformity within the interior cavity 122. The coupling 702 may include a waveguide that directs the electromagnetic energy into the interior cavity 122. FIGS. 7A-7C illustrate three embodiments related to placement and orientation of the coupling 702. However, the scope of the claims may not be limited to three embodiments. For example, the interior cavity 122 may have more than one coupling 702 that may be connected to the same power source 106 or to a second power source (not shown).

The waveguide may include, but is not limited to, a rectangular or circular cross sectional geometry similar to the cross sectional embodiments of the interior cavity 122. In some instances, the coupling 702 or the interior cavity 122 may include tuning or damping mechanisms that minimize electromagnetic energy non-uniformity at the coupling 702 or making the electromagnetic energy resonate within the interior cavity 122. The tuning mechanisms (not shown) may be able to tune electromagnetic energy at the entrance, before the entrance, or after the entrance into the interior cavity 122. The tuning mechanisms may include, but are not limited to, mechanical mechanisms that vary the size of the cross section or volume of the waveguide or the interior cavity 122. The tuning mechanism may be used to accommodate frequency or magnitude changes of the electromagnetic energy.

In the first example, in FIG. 7A, the coupling 702 may be perpendicular or normal to the interior cavity 122 and may be opposite the continuous slit 124 or opposite the surface that includes the continuous slit 126. For example, in one circular cross section embodiment 200, the coupling 702 may be in the same or similar horizontal plane as the continuous slit 126, as shown in the top view of FIG. 7A. For a rectangular interior cavity 122 cross section embodiment 300, the coupling 702 may be opposite and in the same horizontal plane as the continuous slit 126 or perpendicular to the surface that includes the continuous slit 126. When the coupling 702 is perpendicular to the surface of the FIG. 7A page and it may or may not be in the same horizontal plane (not shown) as the continuous slit 126. However, in other rectangular embodiments, the waveguide may be substantially perpendicular to the horizontal plane (not shown) that includes the continuous slit 126. In this instance, the coupling 702 would extend up out of the page of FIG. 7A.

In the second example 704, as shown in FIG. 7B, the side coupling 706 is connected to the interior cavity 122 in a substantially tangential manner. In contrast to the FIG. 7A embodiment, the electromagnetic energy may not be directed to the center of the plasma chamber 102. Rather, the side coupling 706 may direct the electromagnetic energy off-center or tangentially to the center of the plasma chamber 102. A tangential intersection between the power transmission element 112 and the side coupling 706 may be implemented by a perpendicular intersection of a side coupling centerline 708 and a power transmission element centerline 710. The angle between the two intersecting lines may be ninety degrees (+/−ten degrees). The side coupling 706 may provide the electromagnetic energy in the substantially similar horizontal plane (not shown) as the continuous slit 124. The side coupling 706 may also have the same type of cross-sectional geometry as the coupling 702 in FIG. 7A.

In the third example 712, as shown in FIG. 7C, the cross section geometry of the coupling may be wider near the interior chamber 122 and narrower or smaller further away from the interior chamber 122. The wider portion 716 of the variable coupling 714 may enable the disbursement of the electromagnetic energy across a wider area at the entrance point. By disbursing over a wider area, the impact of the entry electromagnetic energy may be dampened such that temperature hot spots or electromagnetic energy non-uniformity across the interior chamber 122 may be lower. Although the variable coupling 714 is shown to be in the same horizontal plane as the continuous slit 124, the angle at which the variable coupling 710 is coupled to the interior chamber may vary up to ninety degrees from this embodiment. The variable coupling would be pointing out of the page when the angle is at ninety degrees.

Figure 8:
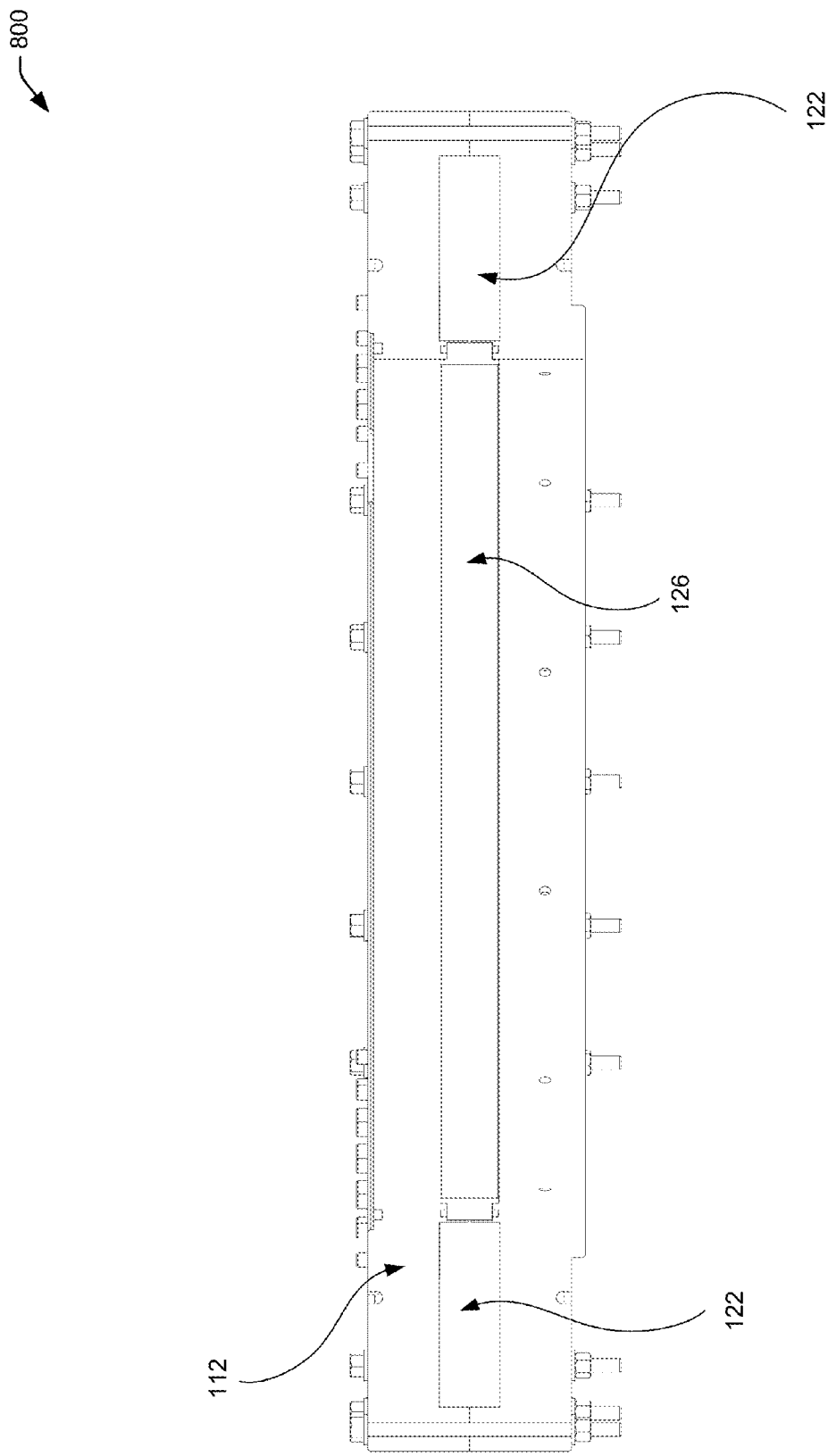
FIG. 8 is a three-dimensional illustration of a cross section of an exemplary power transmission element for a plasma chamber.
Figure 9:
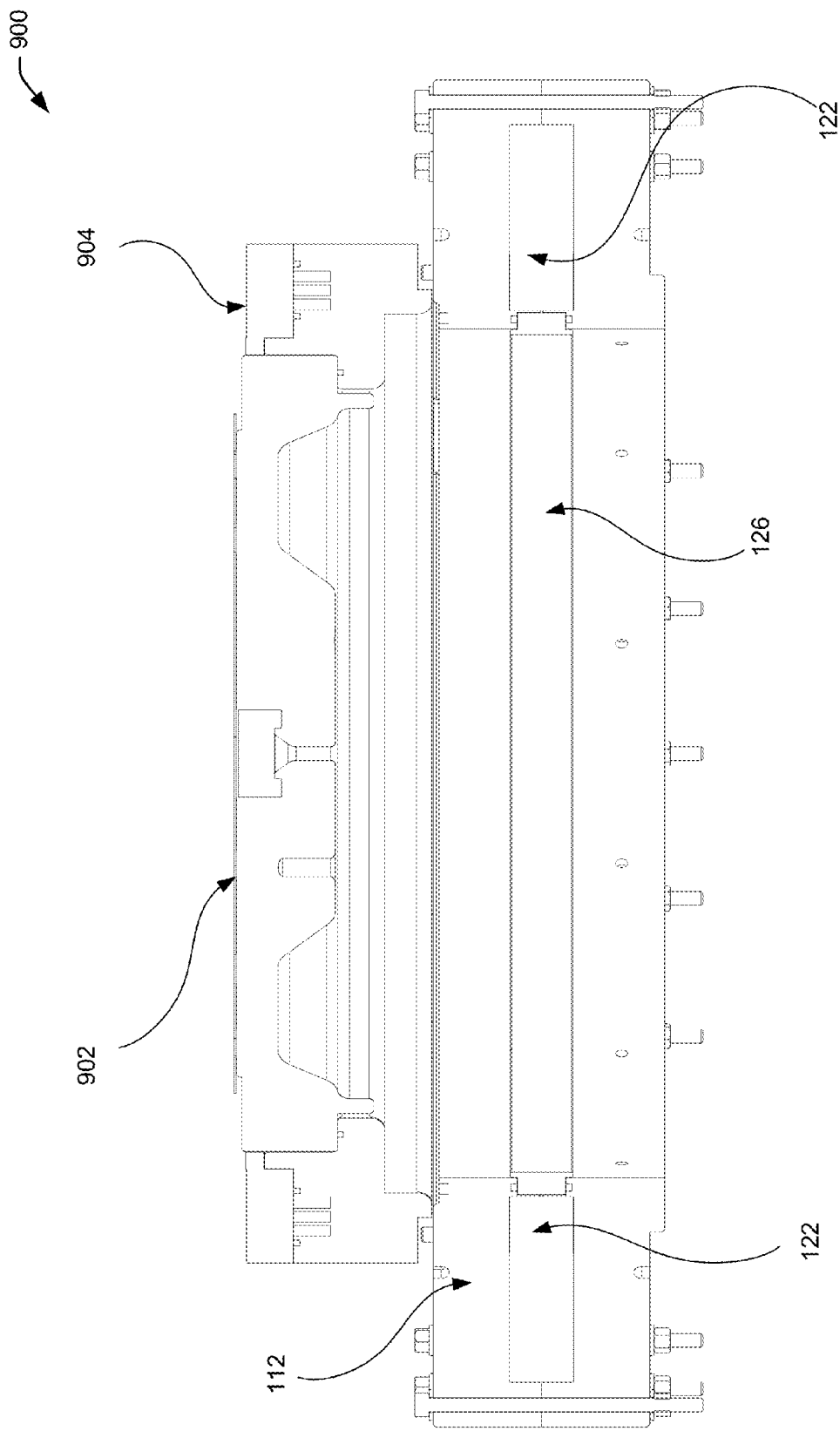
FIG. 9 is a three-dimensional illustration of a cross section of the circular power transmission element connected to a planar power transmission element.
Figure 10:
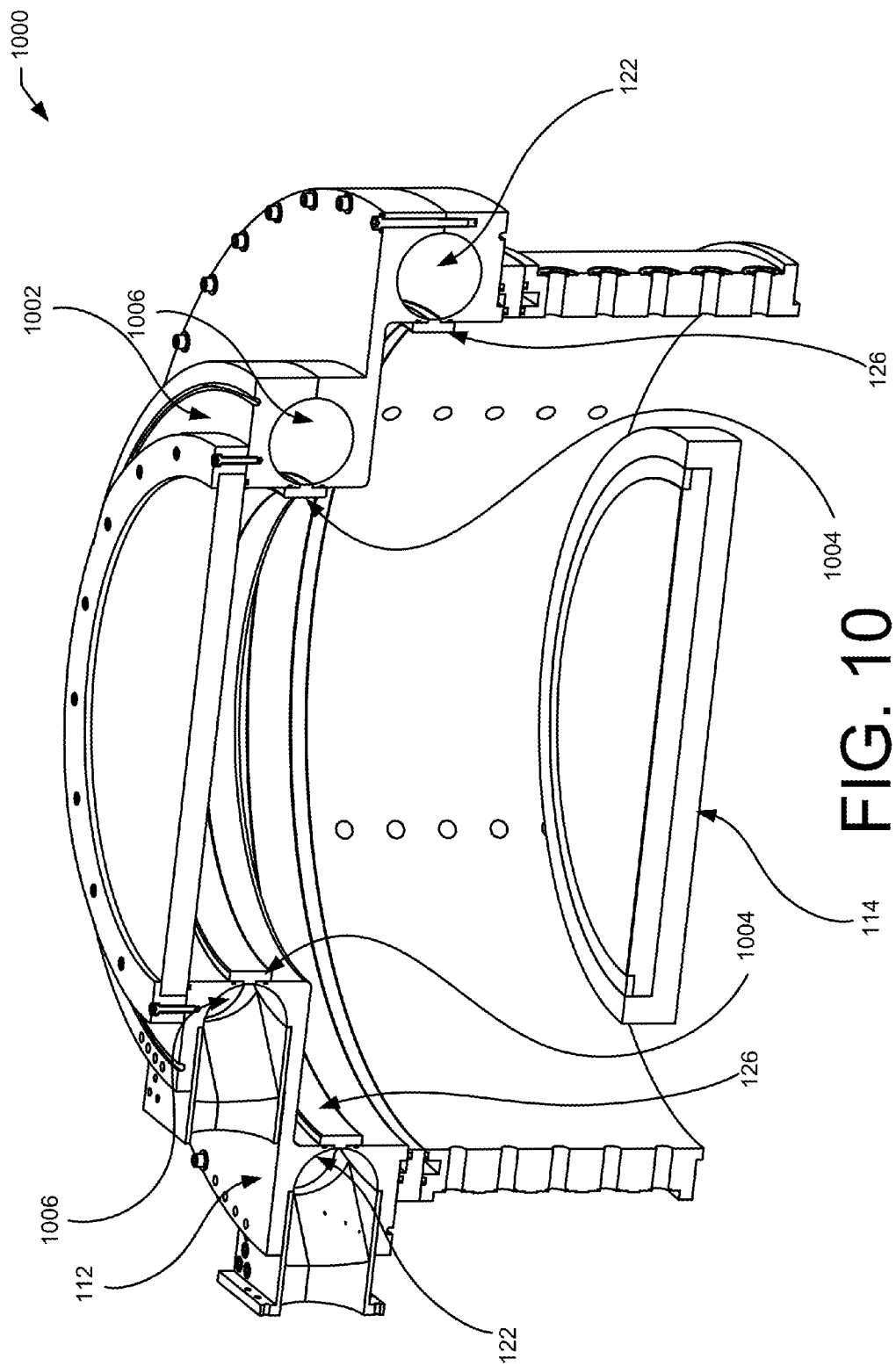
FIG. 10 is a three-dimensional illustration of a cross section of a first circular power transmission element coupled to a second circular power transmission element in the plasma chamber.

FIGS. 8-10 include three-dimensional cross section illustrations of various embodiments of the power transmission element 112. The various embodiments are meant to illustrate some of the ways that the power transmission element 112 may be used with other plasma generating systems to control plasma density within the plasma chamber 102. Although the power transmission element 112 may be used alone to generate and control plasma density, it may be combined with other plasma sources to address plasma density concerns in a complimentary way. FIGS. 8-10 are intended to provide three-dimensional representation to the two-dimensional drawings discussed in the description of FIGS. 1-7 and are not intended to impart limitations to those descriptions.

FIG. 8 is a three-dimensional cross-section illustration 800 of an exemplary power transmission element 112 for a plasma chamber 102. This is a single element embodiment of what the circular power transmission element 112 may look like when used by itself to generate plasma in the plasma chamber 102. The interior cavity 122 is shown to be rectangular and extends around the power transmission element 112 in a circular manner. The dielectric component 126 covers a continuous slit (not visible in FIG. 8) that enables the propagation of the electromagnetic field 212 into the plasma chamber 102. The coupling 702 of the power source 106 is not shown in FIG. 8 but the coupling 702 would be present in a non-cross sectioned illustration.

FIG. 9 is a three-dimensional cross-section illustration 900 of a circular power transmission element 112 coupled, via a source offset component 904, to a planar power transmission element 902. The coupling of the power transmission element 112 and the planar power transmission element may be used to control plasma density in a dual manner. For example, the power transmission element 112 may be used to influence plasma density closer to the edge of the plasma chamber 102 while the planar power transmission element 902 may be used to influence plasma density near the center of the plasma chamber 102. The combination may enable a higher degree of control of the plasma density across plasma chamber 102 than each element by itself.

In FIG. 9, the planar power transmission element 902 is shown to be a radial line slot antenna (RLSA™) that may be coupled to the power transmission element 112 directly or via the source offset component 904 that may be used to align and/or offset the two sources. The two sources may be used concurrently during the process or separately to address plasma density non-uniformity by making the plasma density more uniform or non-uniform depending on the process needed to treat the substrate. For example, the substrate may have an inherent non-uniformity in thickness or composition that may use a localized plasma density difference to account for or to correct during plasma processing. The power applied to the sources may vary in magnitude, frequency, and/or time to accomplish an end result on the substrate.

The planar power transmission element 902 is not limited to the RLSA™ configuration or surface-wave coupled plasma and may be of any type of plasma generation source that may be used in conjunction with the power transmission element 112. For example, the planar power transmission element 902 may include, but is not limited to, the following power coupling modes: DC coupled plasma, inductively coupled plasma, capacitively coupled plasma, or electrodeless plasma excitation.

FIG. 10 is a three-dimensional cross-section illustration 1000 of a first circular power transmission element 112 coupled to a second circular power transmission element 1002 in a plasma chamber 102. The combination of power transmission elements 112, 1002 may be used to improve plasma density across the plasma chamber 102 during substrate processing. In the FIG. 10 embodiment, the second power transmission element may have a smaller diameter than the first transmission element 112. This configuration may enable the second power transmission element 1002 to control or influence the plasma density closer to the substrate (not shown) in the center of the plasma chamber 102. However, in other embodiments, the diameter of the second power transmission element 1002 may be the same or larger than the first power transmission element 112. The second power transmission element 1002 may also include an interior cavity 1006 with a continuous slit (not shown) along the inner diameter. The continuous slit may be covered by a dielectric component 1004.

The first and second power transmission elements 112, 1002 may be used separately or in combination to the plasma density profile (not shown) in the plasma chamber 102. For example, the second power transmission element 1002 may drive a etch rate near the center of the substrate while the first power transmission element 112 may drive a relatively higher etch rate near the edge of the substrate or vice versa. The FIG. 10 embodiment may also include a third power transmission element (not shown) that may be placed above the second power transmission element 1002. The third transmission element may include, but is not limited to, another circular power transmission element 112 or a planar transmission source 902 as described in the description of FIG. 9. In fact, a non-circular or linear power transmission element may also be integrated with the power transmission element, as shown in FIG. 11.

Figure 11:
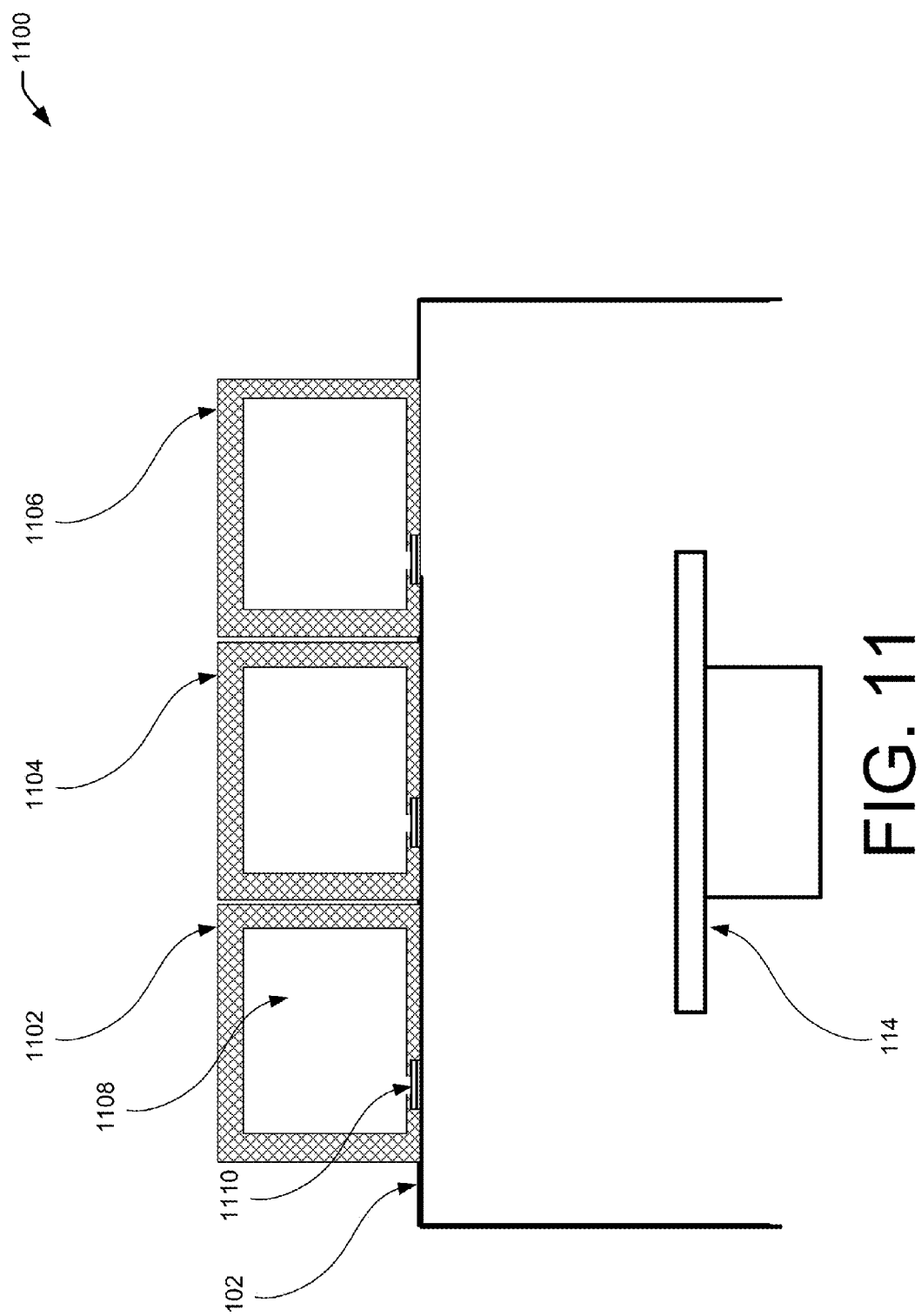
FIG. 11 is a two-dimensional cross section illustration of a linear power transmission element in the plasma chamber.

FIG. 11 is a two-dimensional cross-section illustration 1100 of one or more linear power transmission elements 1102, 1104, 1106 in a plasma chamber 102. The linear power transmission element 1002 may be used to propagate electromagnetic energy through a linear interior cavity 1108 to generate an electric field (not shown) to propagate into the plasma chamber 102. The electric field may propagate through a linear dielectric component 1110 that may isolate the linear interior cavity 1108 from process gas in the plasma chamber.

The linear power transmission element 1102 may be opposite the substrate holder 114 and may be used to control plasma density profiles near the substrate holder 114. The cross section of the linear interior cavity 1108 may be rectangular, as illustrated, square, or circular. The linear interior cavity 1108 may be filled with gas, liquid, or a solid propagation medium. The gas may include, but is not limited to; air, nitrogen, argon and the solid medium may include, but is not limited to, quartz or ceramic materials.

In contrast to the circular power transmission element 112, the linear power transmission element 1102 is open ended, in that the electromagnetic energy propagates linearly instead of in a circle. The electromagnetic energy may be propagated in TE or TM mode. In one specific $TE_{10}$ embodiment, the linear interior cavity 1108 may be rectangular (27 mm×96 mm) with a continuous slit along the short side of the rectangular cross section. The electromagnetic energy may be propagated with a frequency of approximately 2.45 GHz. Another specific embodiment including a $TE_{11}$ mode wave may have a linear interior cavity (not shown) with a circular cross section that has a continuous slit along its length that is proximate to the plasma processing region in the plasma chamber 102. The circular cross section may have a diameter of approximately 80 mm.

FIG. 12 is a two-dimensional cross section illustration 1200 of the power transmission element 112 comprising overlapping slots that can vary the amount of power emitted from the power transmission element. In the rectangular slit embodiment 534, as shown in FIG. 5C, the number of rectangular slits may vary on the process conditions for the plasma process. Accordingly, a capability that may enable the reconfiguration of the slits, rectangular or otherwise, without replacing the power transmission element 112 may be desirable. A horizontal adjustment embodiment 1202 may be one way to enable the automatic adjustment capability. The automatic horizontal adjustment may enable varying the amount of power that may be provided to the plasma process chamber. FIG. 12 also includes a top view of a half power embodiment 1204 and a top view of a full power embodiment 1206 slit configurations that may be enabled by the horizontal adjustment embodiment 1202. The aforementioned embodiments are not limited to half or full power configurations and may include different power embodiments ranging across the power spectrum.

The horizontal adjustment embodiment 1202 may include a power transmission element with an interior cavity 122 and, in this embodiment, a rectangular slit 536 that may be proximate to a horizontal adjustment wall 1208 that may move horizontally to cover or expose a portion or the entire rectangular slit 536. The horizontal adjustment wall 1208 may be disposed between the rectangular slit 536 and the dielectric component 126 that may cover the one or more rectangular slits 536 and isolate the interior cavity 122 and the horizontal adjustment wall 1208 from the plasma process chamber 102. The horizontal adjustment wall 1208 may be made of a metal or dielectric material or any other material that may enable varying the transmission of the electromagnetic wave 212 into the plasma chamber 102. The horizontal adjustment wall 1208 may also include a ¼ wavelength choke 1210 to act as an electrical short, but still allow the movement of the horizontal adjustment wall 1208. A horizontal movement mechanism 1212 may be used to move the horizontal adjustment wall 1208 back and forth along the power transmission element 112. The horizontal movement mechanism 1212 may be any mechanical assembly, electrical assembly, or combination thereof that may enable moving all or selected of the horizontal adjustment wall 1208 to control the radial or azimuthal power that may be transmitted into the plasma chamber 102. The horizontal adjustable wall 1208 may be made of a dielectric material (e.g., quartz, silicon, ceramic, etc.) or a reflective metal (e.g., aluminum, steel, etc.).

The top view of the half power embodiment 1204 and the top view of the full power embodiment 1206 are intended to show the relationship of the rectangular slit 536, the power transmission element 112, the one or more horizontal adjustment walls 1208 or mode walls. The choke 1210 and the horizontal movement mechanism 1212 are not shown for ease of illustration of the aforementioned wall/slit relationship.

The top view of the half power embodiment 1204 illustrates the covering or blocking of one more slits (e.g., blocked slits 1214) and the exposure of one or more slits (e.g., rectangular slits 536). The blocking of the slits (e.g., blocked slits 1214) may reduce the amount of power to the plasma chamber 102. In this embodiment, when half of the slits are blocked, the power transmission may be half of the amount when all of the slits are not blocked by the horizontal adjustment walls 1208 (or mode walls). This may be accomplished by moving individual horizontal adjustment walls 1208 to cover selected rectangular slits 536. In other embodiments, the horizontal adjustment walls may cover a portion of each of the selected slits or cover a portion of all the slits in the power transmission element 112.

In comparison, the top view of the full power embodiment 1206 illustrates an embodiment where all of the rectangular slits 536 are fully exposed to the plasma chamber 102. In this way, the unblocked slits enable the maximum amount of power to be transmitted based, at least in part, on the power of the propagating electromagnetic wave and the unblocked slit design of the power transmission element 112. In this embodiment, the horizontal movement mechanism 1212 has moved all of the horizontal adjustment walls 1208 into a position that prevents the rectangular slits 536 from being covered.

In a continuous slit embodiment (not shown), the horizontal adjustment walls may be moved to form rectangular slits that coincide with the mode of the electromagnetic wave propagating in the interior cavity 122. In other embodiments, the vertical gap distance of the continuous slit 124 or rectangular slit 536 may also be adjusted to vary the magnitude of the power transmission to the plasma chamber 102.

FIG. 13 is a two-dimensional cross section illustration 1300 of the power transmission element 112 comprising a vertical adjustment wall 1304 that can vary the amount of power emitted from the power transmission element 112 by varying the gap distance of the continuous slit 124 or the rectangular slit 536 (not shown). The vertical adjustment wall 1304 may be used to control the radial or azimuthal power that may be transmitted into the plasma chamber 102.

In this embodiment, the vertical adjustment wall 1304 may be incorporated to form a portion of the power transmission element 112 that may be exposed to the electromagnetic wave propagating in the interior cavity 122. The lower portion of the continuous slit 124 may not be moved while the vertical adjustment wall 1304 may be moved by the vertical adjustment mechanism 1306. The vertical movement may be enabled by a mechanical assembly (not shown), electrical assembly, (not shown), or a combination thereof. For examples, the mechanical assembly may include a spring or elliptical wheel and the electrical assembly may include magnets that may push or pull the vertical adjustment wall 1304. The vertical adjustment wall 1304 may also include a ¼ wavelength choke 1308 to act as an electrical short, yet allow a gap to enable the vertical movement. In one embodiment, the vertical movement of the vertical adjustment wall 1304 may range between 0 mm and 25 mm. The vertical adjustment wall 1304 may be made of a metal or dielectric material or any other material that may enable varying the transmission of the electromagnetic wave 212 into the plasma chamber 102. The vertical adjustment wall 1304 may be made of a dielectric material (e.g., quartz, silicon, ceramic, etc.) or a reflective metal (e.g., aluminum, steel, etc.).

Figure 14:
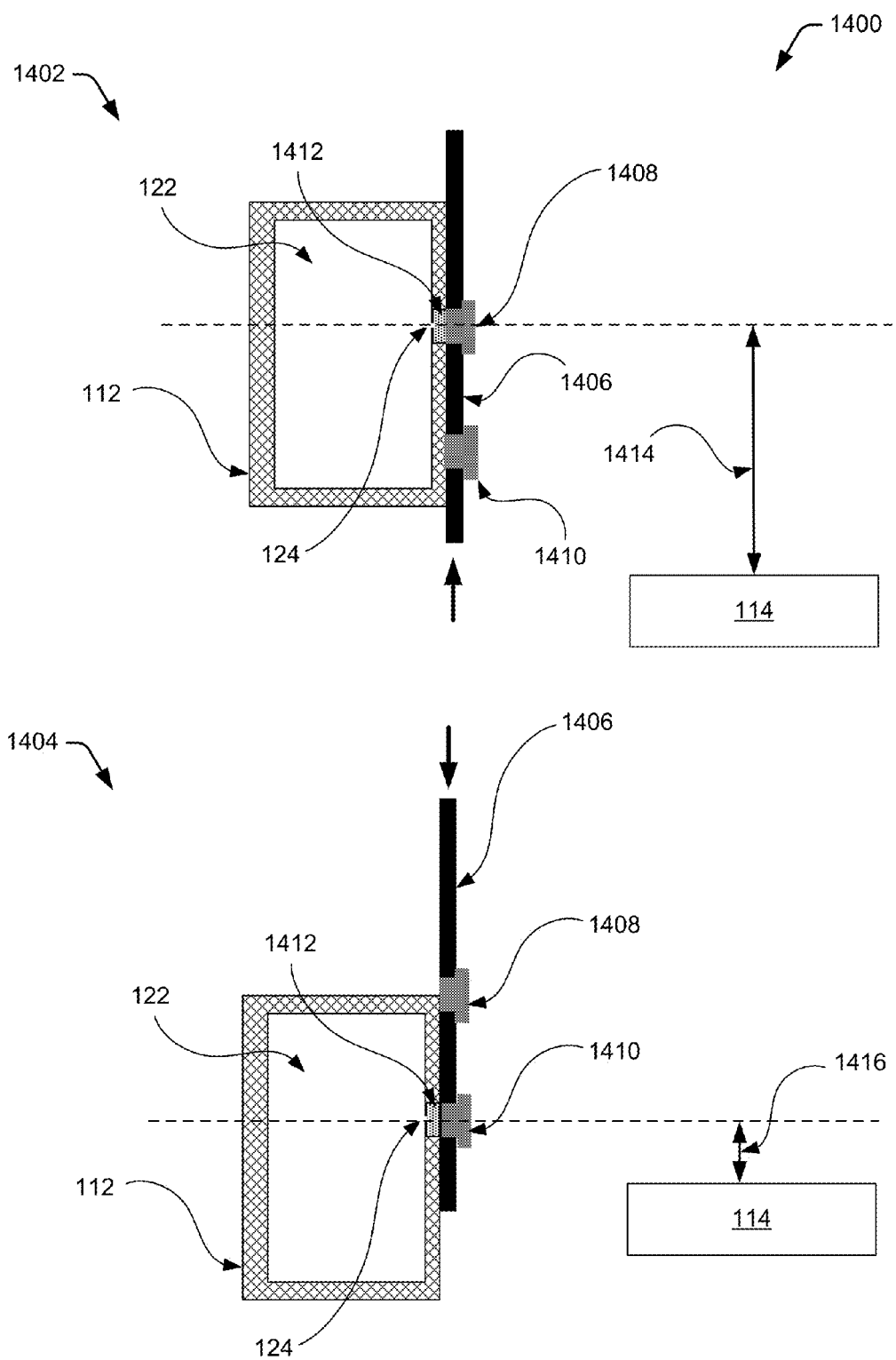
FIG. 14 is a two-dimensional cross section illustration of the power transmission element that can move between power transmission slits located at different locations of the plasma process chamber.

FIG. 14 is two-dimensional cross section illustrations 1400 of the power transmission element 112 that can move between an upper power transmission location embodiment 1402 and a lower power transmission location embodiment 1404. In the FIG. 14 embodiment, the chamber wall 1406 may move in a vertical direction to enable the location of the substrate holder to vary with respect to the entry point of the power into the plasma chamber 102 (e.g., continuous slit 124, rectangular slit 536, etc.). In another embodiment, the power transmission element 112 may move in a vertical direction to enable the location of the substrate holder 114 to vary with respect to the entry point of the power into the plasma chamber 102 (e.g., continuous slit 124, rectangular slit 536, etc.). In yet another embodiment, the vertical movement of the chamber wall 1406 or the power transmission element 112 may vary between two or more power entry points into the chamber. For example, the chamber wall 1406 may have four dielectric components instead of the two dielectric components (e.g., upper dielectric component 1408, lower dielectric component 1410).

In the upper power transmission location embodiment 1402, the power transmission element 112 may include a cap dielectric component 1412 that may be adjacent to the upper dielectric component 1408. The cap dielectric component 1412 may or the upper dielectric component may isolate the interior cavity 122 from the plasma process chamber and enable moving between the upper power transmission location embodiment 1402 and the lower power transmission location embodiment 1404 without breaking vacuum isolation between the interior cavity 122 and the plasma chamber 102. In this embodiment, the cap dielectric component 1412 may be disposed between the upper dielectric component 1408 and the continuous slit 124 (or the rectangular slit 536, etc.). The cap dielectric component 1412 may be made of any dielectric material that enables the propagation of the electromagnetic field 212 into the plasma chamber. The dielectric material may include, but is not limited to, quartz or ceramic.

The upper power transmission location embodiment 1402 comprises a first vertical distance 1414 between the continuous slit 124 and the substrate holder 114. In this FIG. 14 embodiment, the substrate holder 114 may move in conjunction with the chamber wall 1406 as indicated by the upward arrow at the bottom portion of the chamber wall 1406. Hence, the first vertical distance 1414 may decrease when transitioning to the lower power transmission location embodiment 1404. One aspect of the change in the first vertical distance 1414 may be the impact on the energy distribution of the electromagnetic field 212 (not shown) that is transmitted by the power transmission element 112. This change may impact plasma density uniformity or other plasma characteristics proximate to the substrate holder 114. The transition between the upper power transmission embodiment 1402 and the lower transmission embodiment 1404 may be enable by a mechanical assembly that moves the plasma chamber 102 in the vertical direction or, in other embodiments, moves the power transmission element 122 in a vertical direction.

In the lower power transmission location embodiment 1404, the cap dielectric component 1412 is disposed between the continuous slit 124 (or rectangular slit 536, etc.) and the lower dielectric component 1410. In this position, the substrate holder 114 may be located at a second vertical distance 1416 that is less than the first vertical distance 1414. The change in vertical distance may be used to account for varying power conditions that may be used to treat different types of substrates or different types of plasma processes within the same plasma chamber 102.

Figure 15:
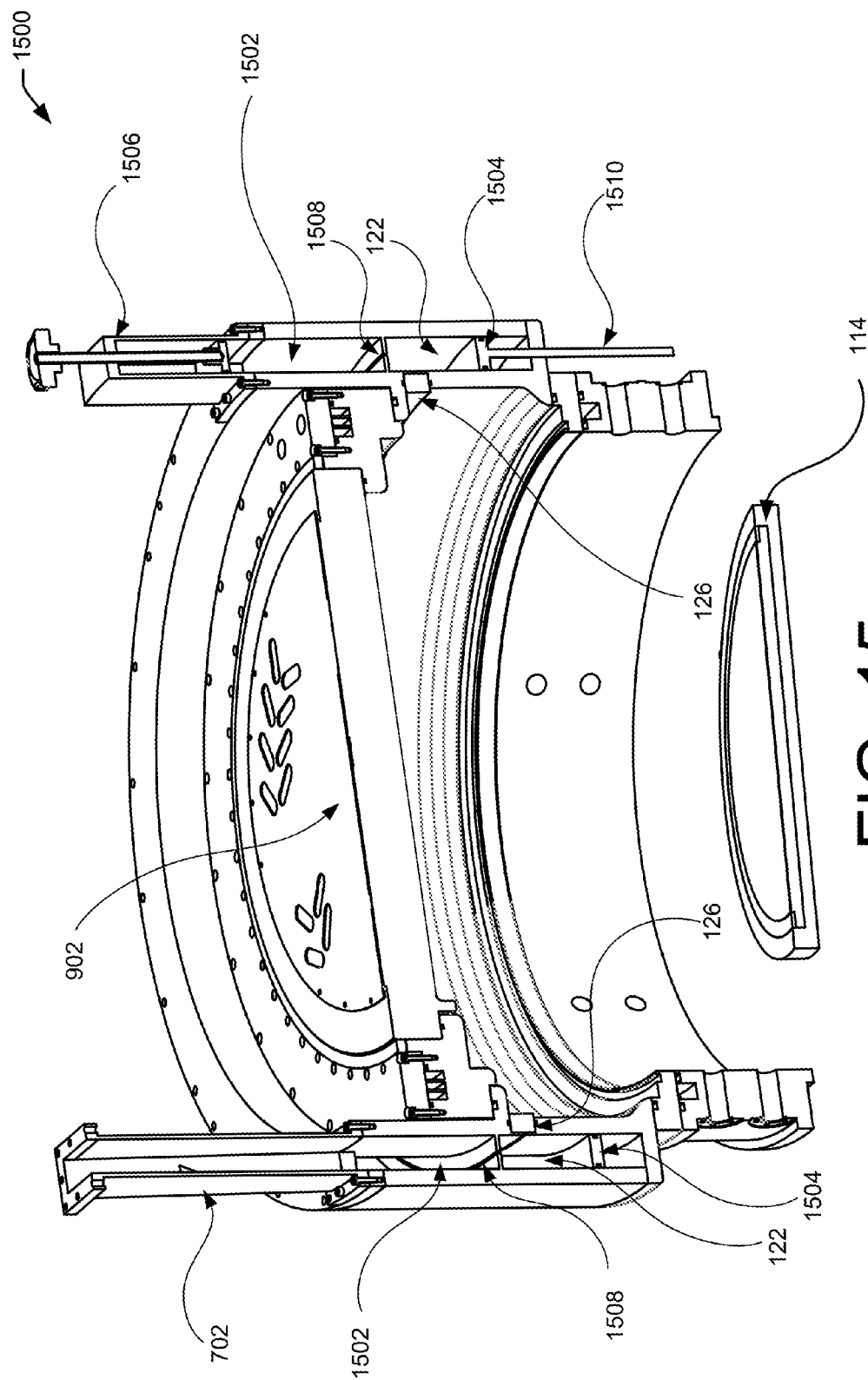
FIG. 15 is a three-dimensional illustration of a cross section of a power transmission element comprising a buffer cavity and a tuning mechanism that can uniformly change the volume of the power transmission element.

FIG. 15 is a three-dimensional illustration 1500 of a cross section of a power transmission element 112 comprising a buffer cavity 1502 and a tuning mechanism 1504 that can uniformly change the volume of the power transmission element. The buffer cavity 1502 may be used to smooth any variance or fluctuations in the incoming power provided by the power coupling 702 that may be connected to the plasma source 106 (not shown). The buffer cavity 1502 may be used to transfer power uniformly by being of similar geometry of the power transmission element 112. In the FIG. 15 embodiment, the cross section geometry of the buffer cavity 1502 and the power transmission element are substantially similar (e.g., rectangular), but the cross section geometries may be different (e.g., circular, square, etc.) between the two elements in other embodiments. The buffer cavity 1502 may also include a buffer cavity tuning assembly 1506 to tune the incoming electromagnetic energy (e.g., power) that may be transferred to the power transmission element 112.

In one embodiment, the incoming electromagnetic energy may be provided to the buffer cavity 1502 from the plasma power source 106. The electromagnetic energy may be propagated around or along the buffer cavity 1502. The electromagnetic energy may be tuned within the buffer cavity 1502 using the buffer cavity tuning assembly 1506. Next, the electromagnetic energy may be transferred to the power transmission element 112 via a transfer slit 1508 or opening between the buffer cavity 1502 and the power transmission element 112. In one specific embodiment, the transfer slit 1508 may include a transfer dielectric component (not shown) that is fluid communication with the power transmission element 112 and the buffer cavity 1502. The tuning mechanism 1504 may tune the electromagnetic energy that may be used to generate a potential difference (e.g., a negative charged surface and a positively charged surface 210) in the continuous slit 124 (or rectangular slit 536) that may generate an electromagnetic field 212 (not shown) that is propagated into the plasma chamber 102 via the dielectric component 126.

In the FIG. 15 embodiment, the buffer cavity 1502 circular geometry or structure may be overlaid above the circular geometry or structure of the power transmission element 112. However, in other embodiments, the buffer cavity 1502 may be below or adjacent to the power transmission element 112. In this embodiment, the planar power transmission element 902 is disposed above the substrate holder 114. The planar power transmission element 902 may not be present in other embodiments.

The tuning mechanism 1504 may be formed to be part of the interior cavity 122, such that the tuning mechanism 1504 may alter the volume of the interior cavity 122 in a uniform way. In the FIG. 15 embodiment, tuning mechanism 1504 may form one side of the rectangular interior cavity 112 and may change the interior cavity volume by moving in a vertical direction towards or away from the buffer cavity 1502. The tuning mechanism 15404 may be moved by a mechanical or electrical assembly (not shown) that moves the tuning arm 1510 in a vertical direction.

In another embodiment, the tuning mechanism 1504 may include a vertical side of the interior cavity 122 may be moved horizontally to change the volume of the interior cavity 1502.

It is to be appreciated that the Detailed Description section, and not the Abstract section, is intended to be used to interpret the claims. The Abstract section can set forth one or more, but not all exemplary embodiments, of the present disclosure, and thus, is not intended to limit the present disclosure and the appended claims in any way.

While the present disclosure has been illustrated by the description of one or more embodiments thereof, and while the embodiments have been described in considerable detail, they are not intended to restrict or in any way limit the scope of the appended claims to such detail. Additional advantages and modifications will readily appear to those skilled in art. The invention in its broader aspects is therefore not limited to the specific details, representative apparatus and method and illustrative examples shown and described. Accordingly, departures may be made from such details without departing from the scope of the general inventive concept.

What is claimed is:

1. A plasma processing system comprising:
a plasma chamber including an upper sidewall;
a substrate holder to support a substrate;
an annular power transmission element supported on top of the upper sidewall and surrounding the substrate holder, the power transmission element comprising at least a first opening that is a continuous annular slit and a second opening that is a continuous annular slit, the second opening positioned above the first opening along an inner side of the power transmission element;
a power source that can provide a power signal to the power transmission element that enables the system to generate a plasma;
a first dielectric component arranged to cover first opening in the power transmission element; and
a second dielectric component arranged to cover the second opening,
wherein the first dielectric component and the second dielectric component are separated from each other, and
wherein the first and second dielectric components are each configured to transmit at least a portion of the power signal received through the first and second openings,
wherein the power transmission element includes an interior cavity, and the first and second openings are located on a side wall that is perpendicular to the substrate holder.

2. The system of claim 1, wherein the first and second openings are arranged along an offset line that is offset above or below a center line of the one side of the power transmission element.

3. The system of claim 1, wherein the first and second openings are arranged along a center line of the one side of the power transmission element.

4. The system of claim 1, wherein the first opening or second opening comprises a slit that is angled less than 90 degrees and greater than zero degrees from the center line.

5. The system of claim 1, wherein the power signal comprises a frequency between 300 MHz and 300 GHz.

6. The system of claim 1, wherein the interior cavity propagates electromagnetic waves and is adjacent to the first and second openings, the system further comprising:
a mode wall assembly disposed between the first and second openings and the first and second dielectric components, the mode wall assembly comprising:
one or more walls that can cover at least a portion of the openings;
a wall moving mechanism that can move the walls to cover or uncover the openings using the walls.

7. The system of claim 6, wherein the power transmission element comprises a movable wall of the interior cavity that can be moved to change a gap distance of the continuous slit.

8. The system of claim 7, wherein the gap distance can vary between zero mm and 25 mm.

9. The system of claim 1, wherein the power transmission element comprises a rectangular cross section or a square cross section.

10. The system of claim 1, wherein the interior cavity has a rectangular cross section with a first side that is longer than a second side.

11. The system of claim 10, wherein the first and second openings are on the first side.

* * * * *